US010770117B1

(12) United States Patent
Takekida

(10) Patent No.: US 10,770,117 B1
(45) Date of Patent: Sep. 8, 2020

(54) SEMICONDUCTOR STORAGE DEVICE

(71) Applicant: TOSHIBA MEMORY CORPORATION, Tokyo (JP)

(72) Inventor: Hideto Takekida, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/549,788

(22) Filed: Aug. 23, 2019

(30) Foreign Application Priority Data

Mar. 20, 2019 (JP) .................................. 2019-052485

(51) Int. Cl.
| | | |
|---|---|---|
| G11C 5/06 | (2006.01) | |
| H01L 27/11524 | (2017.01) | |
| H01L 27/11529 | (2017.01) | |
| H01L 27/11556 | (2017.01) | |
| H01L 27/1157 | (2017.01) | |
| G11C 16/34 | (2006.01) | |
| H01L 27/11582 | (2017.01) | |
| G11C 16/08 | (2006.01) | |
| G11C 16/16 | (2006.01) | |
| G11C 16/24 | (2006.01) | |
| G11C 16/26 | (2006.01) | |
| H01L 27/11573 | (2017.01) | |

(52) U.S. Cl.
CPC .............. *G11C 5/063* (2013.01); *G11C 16/08* (2013.01); *G11C 16/16* (2013.01); *G11C 16/24* (2013.01); *G11C 16/26* (2013.01); *G11C 16/3445* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC ......... G11C 5/063; G11C 16/08; G11C 16/16; G11C 16/24; G11C 16/3445; G11C 16/26; H01L 27/1157; H01L 27/11573; H01L 27/11529; H01L 27/11582; H01L 27/11524; H01L 27/11556
USPC .................................................... 365/185.29
See application file for complete search history.

(56) References Cited

U.S. PATENT DOCUMENTS

| | | | |
|---|---|---|---|
| 8,786,008 | B2 | 7/2014 | Ishiduki et al. |
| 9,299,447 | B2 | 3/2016 | Lee et al. |
| 10,026,486 | B1 * | 7/2018 | Dutta ................. G11C 16/3459 |
| 10,037,813 | B2 * | 7/2018 | Maejima ................ G11C 16/08 |
| 10,580,504 | B2 * | 3/2020 | Zhao ...................... G11C 16/10 |

(Continued)

*Primary Examiner* — Fernando Hidalgo
(74) *Attorney, Agent, or Firm* — Kim & Stewart LLP

(57) ABSTRACT

A semiconductor storage device includes a source line, a first selection line, word lines, a dummy word line, and a second selection line. A first pillar having a first semiconductor layer extends through the first selection line, the word lines, and the first dummy word line and is connected to the source line. Memory cells are at intersections of the word lines and the first pillar. A conductive layer is on the first semiconductor layer and extends into the first dummy word line. A second pillar with a second semiconductor layer extends through the second selection line and contacts the conductive layer. A bit line is electrically connected to the second semiconductor layer. A control circuit is configured to apply voltages to the various lines during an erasing of the memory cells. A voltage between a source line voltage and a world line voltage is applied to dummy word line.

20 Claims, 19 Drawing Sheets

(56) References Cited

U.S. PATENT DOCUMENTS

2015/0348637 A1  12/2015  Han et al.
2018/0323213 A1  11/2018  Arai

* cited by examiner

SEMICONDUCTOR STORAGE DEVICE

CROSS-REFERENCE TO RELATED APPLICATION

This application is based upon and claims the benefit of priority from Japanese Patent Application No. 2019-052485, filed Mar. 20, 2019, the entire contents of which are incorporated herein by reference.

FIELD

Embodiments described herein relate generally to a semiconductor storage device.

BACKGROUND

As one type of semiconductor storage device, NAND flash memory is known. In particular, NAND flash memory including three-dimensionally stacked memory cells is known.

DETAILED DESCRIPTION

Figure 1:
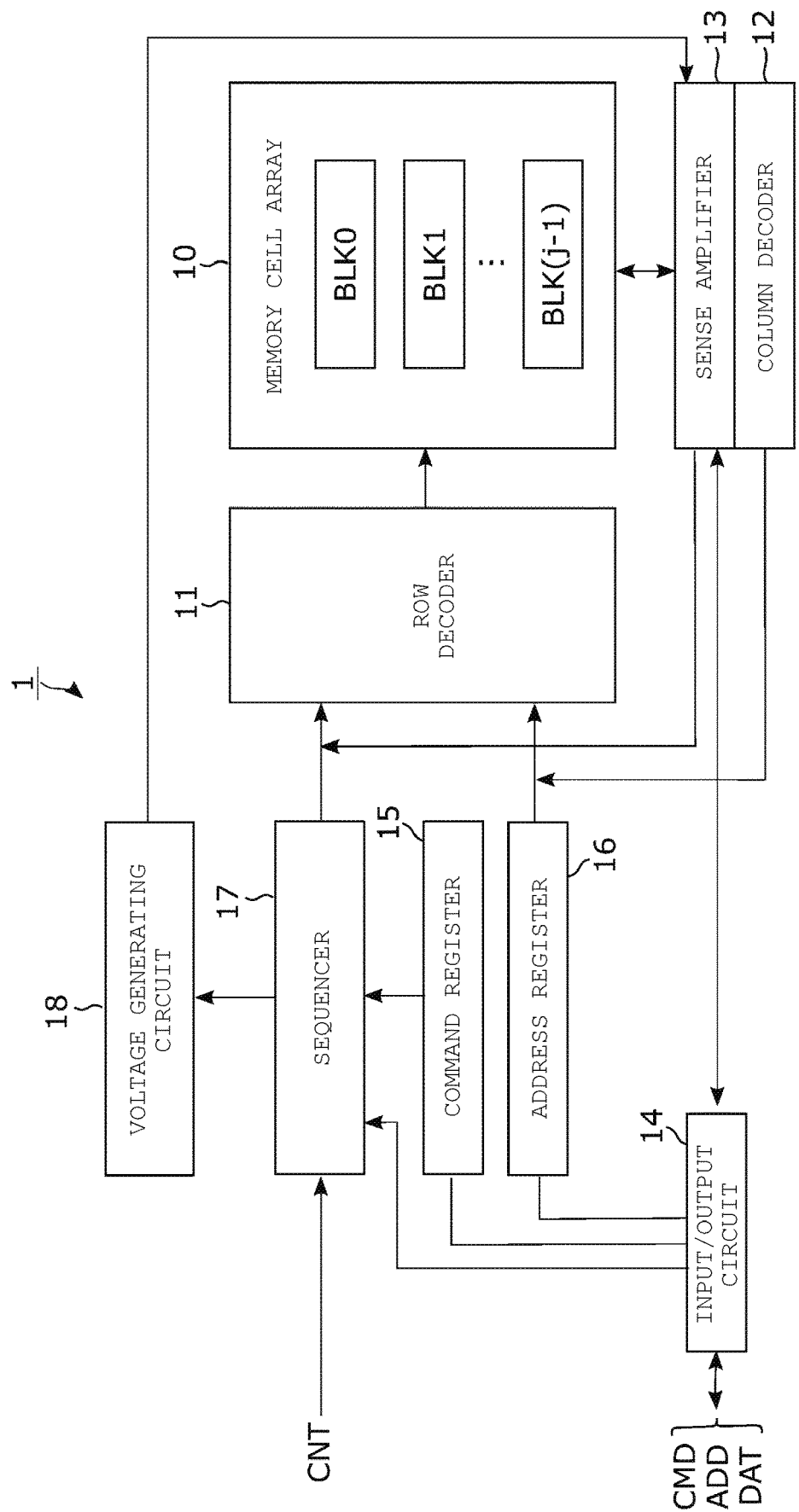
FIG. 1 is a block diagram illustrating a semiconductor storage device according to a first embodiment.

In general, according to one embodiment, a semiconductor storage device, comprising a source line, a first selection gate line, a plurality of word lines, a first dummy word line, and a second selection gate line that are stacked one above the other in this order in a first direction. A first pillar including a first semiconductor layer extends in the first direction through the first selection gate line, the word lines, and the first dummy word line. The first semiconductor layer is electrically connected to the source line. A plurality of memory cells are at the intersections of the first pillar and the word lines. A conductive layer is on the first semiconductor layer, extends into the first dummy word line, and is an N-type diffusion layer. A second pillar including a second semiconductor layer extends in the first direction through the second selection gate line. The second semiconductor layer is in contact with the conductive layer. A bit line is above the second selection gate line in the first direction and is electrically connected to the second semiconductor layer. A control circuit is configured to apply during an erasing operation of the memory cells: a first voltage to the source line, the first selection gate line, the second selection gate line, and the bit line, a second voltage lower than the first voltage to the word lines, and a third voltage that is between the first voltage and the second voltage to the first dummy word line.

Hereinafter, example embodiments will be described with reference to the drawings. Embodiments described below are merely examples of a device or a method for practicing and/or explaining the technical concepts of the present disclosure, and shapes, structures, arrangement, and the like of components are not limited to those described below. The drawings are schematic or conceptual, in which a relationship between the thickness and the width of each component, a ratio between the sizes of components, and the like are not necessarily the same as the actual ones in operational examples. When the same component is shown in different drawings, a dimension or a ratio of the component may vary depending on the drawings. In the following description, components having the same functions and configurations are represented by the same reference numerals, the detailed description thereof will be appropriately omitted, and generally points of difference will be described.

[1] First Embodiment

[1-1] Block Configuration of a Semiconductor Storage Device

A semiconductor storage device 1 according to a first embodiment is a NAND flash memory capable of storing data in a nonvolatile manner. FIG. 1 is a block diagram illustrating the semiconductor storage device 1 according to the first embodiment.

The semiconductor storage device 1 includes a memory cell array 10, a row decoder 11, a column decoder 12, a sense amplifier 13, an input/output circuit 14, a command register 15, an address register 16, a sequencer 17 (also referred to as a control circuit 17 in some contexts), and a voltage generator circuit 18.

The memory cell array 10 includes j blocks, that is, blocks BLK0 to BLK(j−1). Here, j represents an integer of 1 or more. Each of the blocks BLK includes a plurality of memory cell transistors. Each memory cell transistor is comprised of an electrically writable memory cell. A specific configuration of each block BLK will be described below. In the memory cell array 10, a plurality of bit lines, a plurality of word lines, a source line, and the like are provided to control a voltage that is applied to the memory cell transistors.

The row decoder 11 receives a row address from the address register 16 and decodes the received row address. The row decoder 11 executes a selection operation of the word lines based on the decoded row address. The row decoder 11 supplies a plurality of voltages as necessary for a write operation, a read operation, and an erasing operation to the memory cell array 10.

The column decoder 12 receives a column address from the address register 16 and decodes the received column address. The column decoder 12 executes a selection operation of the bit lines based on the decoded column address.

The sense amplifier 13 detects and amplifies data read from the memory cell transistors via the bit line(s) during the read operation. In addition, the sense amplifier 13 transfers write data to the bit line(s) during the write operation.

The input/output (I/O) circuit 14 is connected to an external device, which may be referred to as a host device in certain contexts, through a plurality of input/output lines, also referred to as DQ lines in certain contexts. The input/output circuit 14 receives a command CMD and an address ADD from the external device. The command CMD received by the input/output circuit 14 is transmitted to the command register 15. The address ADD received by the input/output circuit 14 is transmitted to the address register 16. In addition, the input/output circuit 14 transmits and receives data DAT to and from the external device.

The sequencer 17 receives a control signal CNT from the external device. For example, the control signal CNT includes a chip enable signal CEn, a command latch enable signal CLE, an address latch enable signal ALE, a write enable signal WEn, and a read enable signal REn. In this context, when "n" is appended to the signal name, this represents the signal is an active-low signal. The sequencer 17 controls an overall operation of the semiconductor storage device 1 based on the command CMD stored in the command register 15 and the control signal CNT. The sequencer 17 executes the write operation, the read operation, and the erasing operation according to the received command CMD and control signal CNT.

The voltage generator circuit 18 receives a power supply voltage from the outside of the semiconductor storage device 1 and generates voltages required for the write operation, the read operation, and the erasing operation. The voltage generator circuit 18 supplies the generated voltages to the row decoder 11, the sense amplifier 13, and the like.

[1-2] Circuit Configuration of Memory Cell Array

Figure 2:
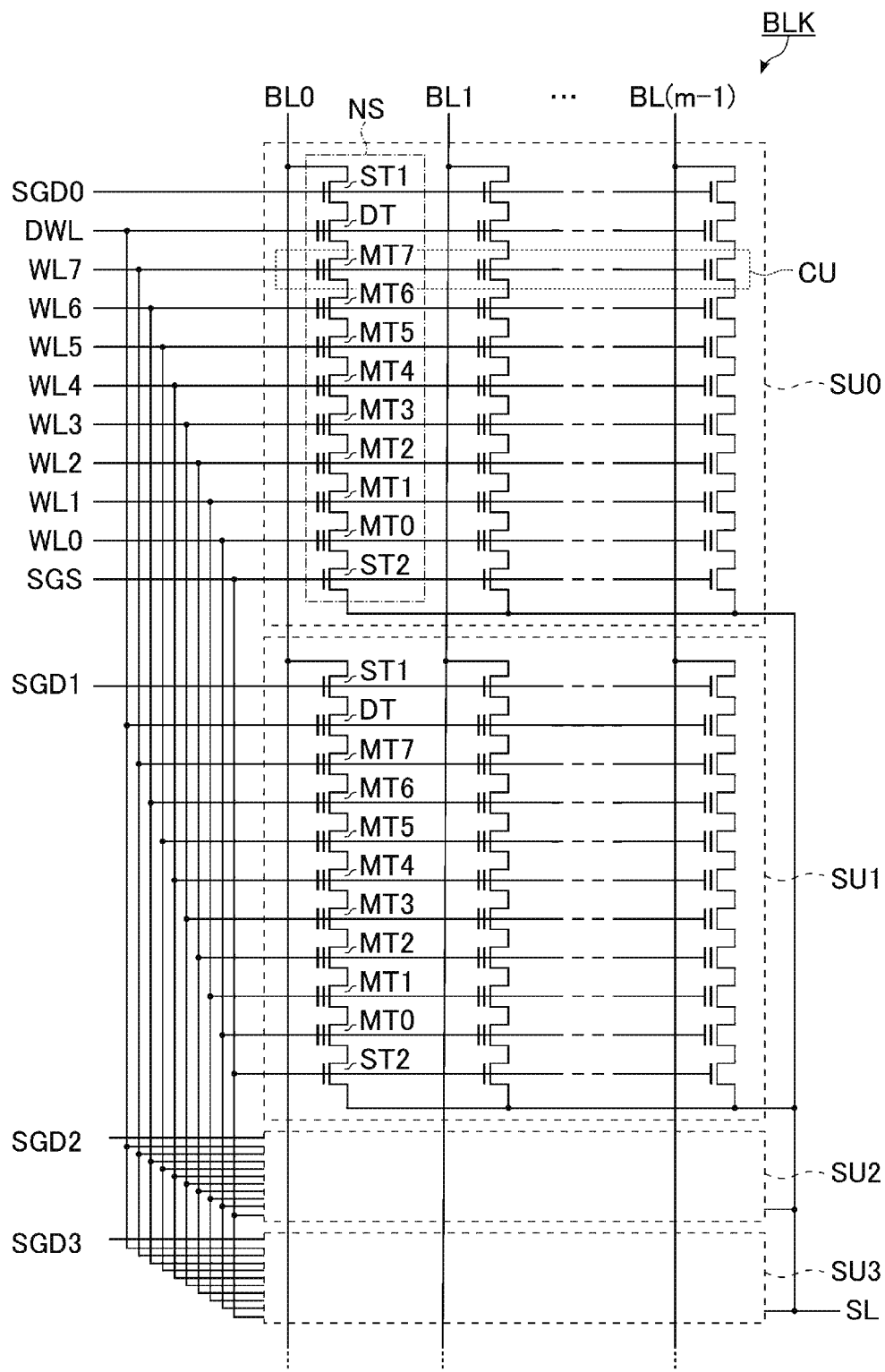
FIG. 2 is a circuit diagram illustrating a block in a memory cell array in a first embodiment.

Next, a circuit configuration of the memory cell array 10 will be described. FIG. 2 is a circuit diagram illustrating a block BLK in the memory cell array 10 illustrated in FIG. 1.

Each block BLK includes a plurality of string units SU. FIG. 2 illustrates four string units SU0 to SU3. The number of string units in one block BLK may be freely set and is not limited to four.

Each of the string units SU includes a plurality of NAND strings NS, also referred to as memory strings in some contexts. The number of NAND strings NS in one string unit SU is not particularly limited.

Each of the NAND strings NS includes a plurality of memory cell transistors MT, a dummy cell transistor DT, and selection transistors ST1 and ST2. The dummy cell transistor DT and the memory cell transistors MT are connected in series between a source of the selection transistor ST1 and a drain of the selection transistor ST2. In this description, a memory cell transistor may also be referred to as a "memory cell" or a "cell". For purposes of simplification, FIG. 2 illustrates a configuration example in which the NAND string NS includes eight memory cell transistors MT (MT0 to MT7). However, the number of memory cell transistors MT in the NAND string NS may typically be more than that illustrated in FIG. 2 and in general may be freely set.

Each memory cell transistor MT includes a control gate electrode and a charge storage layer and stores data in a nonvolatile manner. A memory cell transistor MT may store one-bit data or two bits or more of data. The dummy cell transistor DT has substantially the same structure as that of the memory cell transistor MT, but is not used for storing data.

The selection transistors ST1 and ST2 are used for selection of particular string units SU in various operations. A selection transistor ST1 comprise a plurality of transistors, for example, four transistors that are connected in series. Likewise, the selection transistor ST2 may comprise a plurality of transistors, for example, four transistors that are connected in series.

Gates of selection transistors ST1 in each string unit SU0 are connected in common to a selection gate line SGD0. Likewise, selection gate lines SGD1, SGD2, SGD3 are connected to string units SU1, SU2, SU3, respectively. Gates of selection transistors ST2 in the string unit SU0 are connected in common to a selection gate line SGS. The selection gate line SGS is connected to string units SU1, SU2, SU3, respectively. In some embodiments, individual selection gate lines SGS, rather a common selection gate line SGS, may be connected to each of the string units SU0 to SU3 in each block BLK, respectively.

Control gates of the memory cell transistors MT0 to MT7 in each block BLK are connected to word lines WL0 to WL7, respectively. A control gate of the dummy cell transistor DT is connected to a dummy word line DWL.

Among the NAND strings NS that are arranged in a matrix configuration in each block BLK, drains of the selection transistors ST1 of a plurality of NAND strings NS in the same column are connected in common to a corresponding one of the bit lines BL0 to BL(m−1), where "m" represents an integer of 1 or more. Further, each bit line BL is connected in common to a plurality of blocks BLK, and is connected to one NAND string NS in each string unit SU in each block BLK. Sources of a plurality of selection transistors ST2 in each block BLK are connected in common to a source line SL. The source line SL is connected in common to, for example, a plurality of blocks BLK.

For example, data of memory cell transistors MT in each block BLK is collectively erased. Reading and writing are collectively executed on a plurality of memory cell transistors MT that are connected in common to one word line WL in a string unit SU. The memory cell transistors MT that share a word line WL in one string unit SU will be referred to as "cell unit CU". A collection of one-bit data stored in the memory cell transistors MT of a cell unit CU will be referred to as "page". That is, the write operation and the read operation on a cell unit CU are executed in units of pages.

[1-3] Threshold Voltage Distribution of Memory Cell Transistors MT

Figure 3:
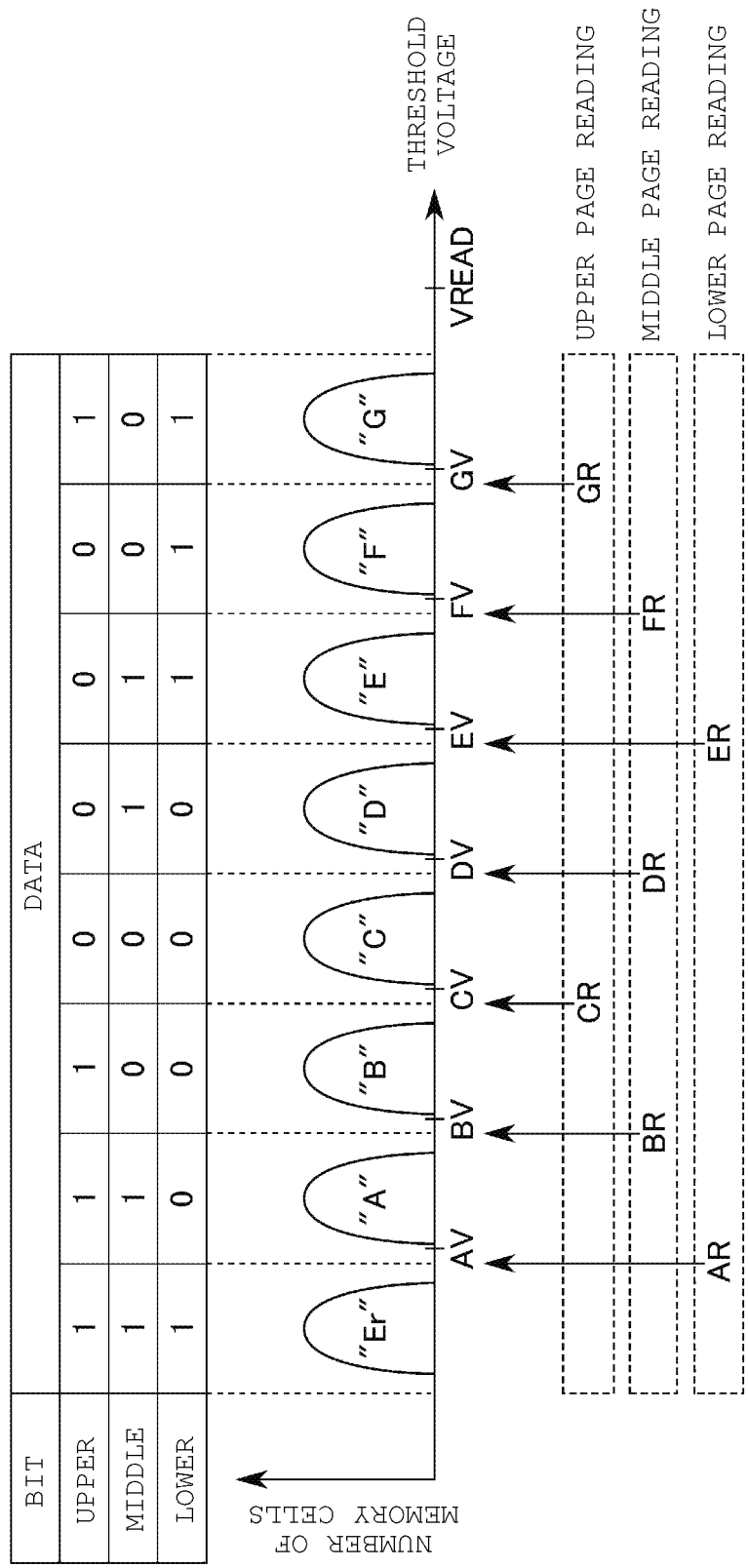
FIG. 3 is a schematic diagram illustrating an example of a threshold voltage distribution of a memory cell transistor.

Next, a distribution of a threshold voltage Vth in the memory cell transistors MT will be described. FIG. 3 is a schematic diagram illustrating an example of the threshold voltage distribution of the memory cell transistors MT. Each memory cell transistor MT may store two bits or more of data. In one example embodiment, a so-called TLC (triple level cell) type in which each memory cell transistor MT stores three-bit data will be described.

The three-bit data is defined by a lower bit, a middle bit, and an upper bit. When the memory cell transistor MT stores three bits, the memory cell transistor MT may adopt any one of eight states corresponding to a plurality of threshold voltages. The eight states will be referred to as states "Er", "A", "B", "C", "D", "E", "F", and "G" in order from the lowest to highest nominal threshold voltage. A plurality of memory cell transistors MT belonging to each of the states "Er", "A", "B", "C", "D", "E", "F", and "G" form a distribution.

For example, data "111", "110", "100", "000", "010", "011", "001", and "101" are assigned to the states "Er", "A", "B", "C", "D", "E", "F", and "G", respectively. When the lower bit is represented by "X", the middle bit is represented by "Y", and the upper bit is represented by "Z", the positions of the different level bits are, in this notation, "Z, Y, X". This coding is merely one example, and different assignments between the threshold voltage distribution and the data values can be freely adopted.

In order to read data stored in a memory cell transistor MT, the threshold voltage state of the memory cell transistor MT is determined. In order to determine the state of the memory cell transistors MT, read voltages AR, BR, CR, DR, ER, FR, and GR are used. Here, the read voltages AR, BR, CR, DR, ER, FR, and GR increase in this order.

For example, the state "Er" corresponds to a state (erased state) in which data is erased. The threshold voltage of the memory cell transistor MT belonging to the state "Er" is lower than the voltage AR and has, for example, a negative value.

The states "A" to "G" correspond to states where charge has been injected into the charge storage layer to write data to the memory cell transistor MT. The threshold voltage of the memory cell transistor MT belonging to each of the states "A" to "G" has, for example, a positive value. The threshold voltage of the memory cell transistor MT belonging to the state "A" is higher than the read voltage AR and is lower than or equal to the read voltage BR. The threshold voltage of the memory cell transistor MT belonging to the state "B" is higher than the read voltage BR and is lower than or equal to the read voltage CR. The threshold voltage of the memory cell transistor MT belonging to the state "C" is higher than the read voltage CR and is lower than or equal to the read voltage DR. The threshold voltage of the memory cell transistor MT belonging to the state "D" is higher than the read voltage DR and is lower than or equal to the read voltage ER. The threshold voltage of the memory cell transistor MT belonging to the state "E" is higher than the read voltage ER and is lower than or equal to the read voltage FR. The threshold voltage of the memory cell transistor MT belonging to the state "F" is higher than the read voltage FR and is lower than or equal to the read voltage GR. The threshold voltage of the memory cell transistor MT belonging to the state "G" is higher than the read voltage GR and is lower than a voltage VREAD.

The voltage VREAD is a voltage that is applied to the word line WL connected to the memory cell transistor MT of the cell unit CU as a non-reading target and is higher than the threshold voltage of the memory cell transistor MT in any of the states. That is, the memory cell transistor MT in which the voltage VREAD is applied to the control gate is in an ON state irrespective of stored data.

In addition, verification voltages used in the respective write operations are set between adjacent threshold voltage distributions. Specifically, verification voltages AV, BV, CV, DV, EV, FV, and GV are set to correspond to the states "A", "B", "C", "D", "E", "F", and "G." The verification voltages AV, BV, CV, DV, EV, FV, and GV are set to be slightly higher than the read voltages AR, BR, CR, DR, ER, FR, and GR, respectively.

As described above, each memory cell transistor MT is set to be in one of the eight states and may store three-bit data accordingly. Reading and writing are executed in units of pages in one cell unit CU. When the memory cell transistors MT store three-bit data, the lower bit, the middle bit, and the upper bit are assigned to three different pages in the cell unit CU. Pages to or from where the lower bit, the middle bit, and the upper bit are collectively written or read will be referred to as "lower page", "middle page", and "upper page", respectively.

When the assignment of the stored data values is as described above, the lower page can be determined by a read operation using the read voltages AR and ER. The middle page can be determined by a read operation using the read voltages BR, DR and FR. The upper page can be determined by a read operation using the read voltages CR and GR.

[1-4] Structure of Memory Cell Array

Next, a structure of the memory cell array 10 will be described. In the drawings that will be referred to below, an X direction corresponds to an extending direction of the word line WL. A Y direction corresponds to an extending direction of the bit line BL. A Z direction corresponds to a direction perpendicular to a surface of a semiconductor substrate on which the semiconductor storage device 1 is formed.

Figure 4:
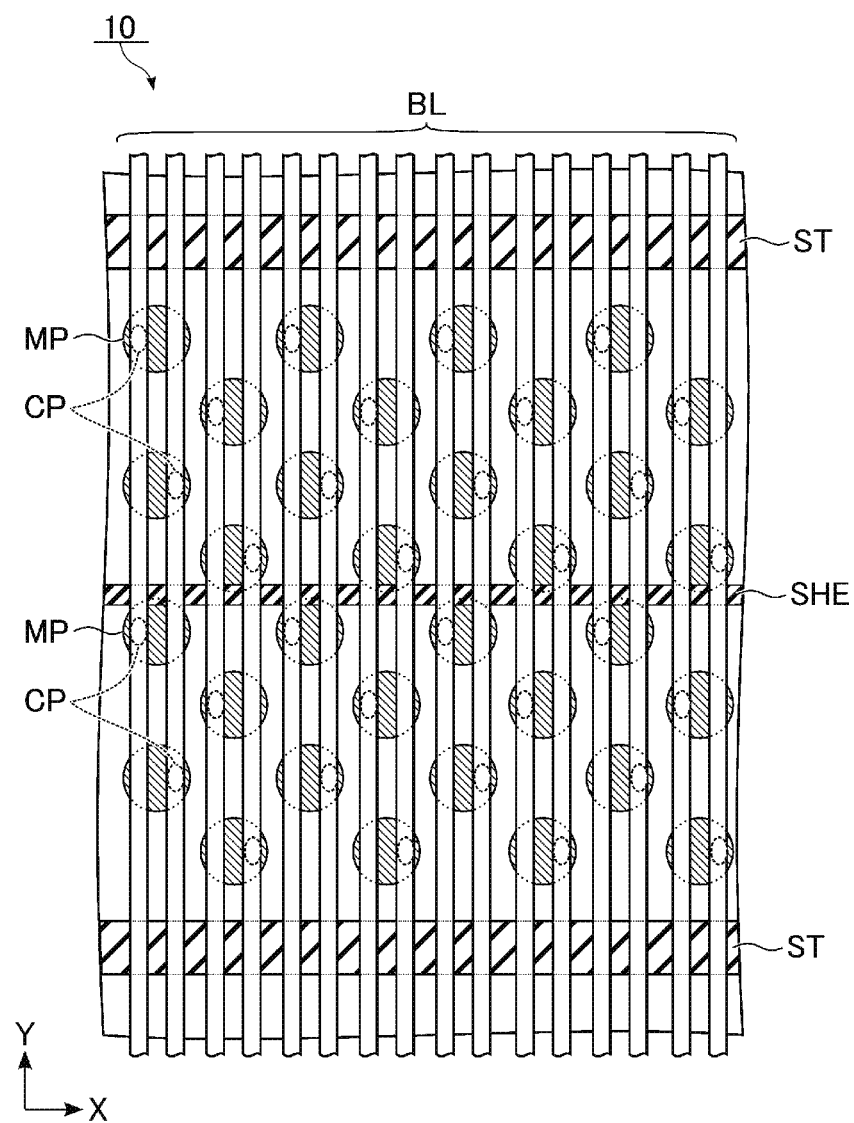
FIG. 4 is a plan view illustrating a region of the memory cell array.

FIG. 4 is a plan view illustrating a region of the memory cell array 10. The memory cell array 10 includes above-described a plurality of memory pillars MP. The memory pillars MP form the NAND strings NS. The memory pillars MP are arranged, for example, in a staggered manner.

The bit lines BL extend in the Y direction and are arranged in the X direction. The memory pillar MP is electrically connected to the bit line BL by a contact plug CP.

In an example of FIG. 4, a pair of adjacent bit lines BL is arranged to overlap each memory pillar MP. Each bit line is connected to every one of the memory pillars MP arranged in a column along the Y direction.

In the memory cell array 10, a plurality of slits ST and a plurality of slits SHE are provided. The slit ST and the slit SHE are formed with insulating layers, for example, silicon oxide ($SiO_2$).

The slits ST extend in the X direction. The slits ST have a function of separating the word lines WL and the selection gate lines SGD and SGS. In addition, the slits ST have a function of separating blocks BLK adjacent to each other in the Y direction.

The slits SHE extend in the X direction. The slits SHE have a function of separating the selection gate line SGD. In addition, the slits SHE have a function of separating string units SU adjacent to each other in the Y direction.

Figure 5:
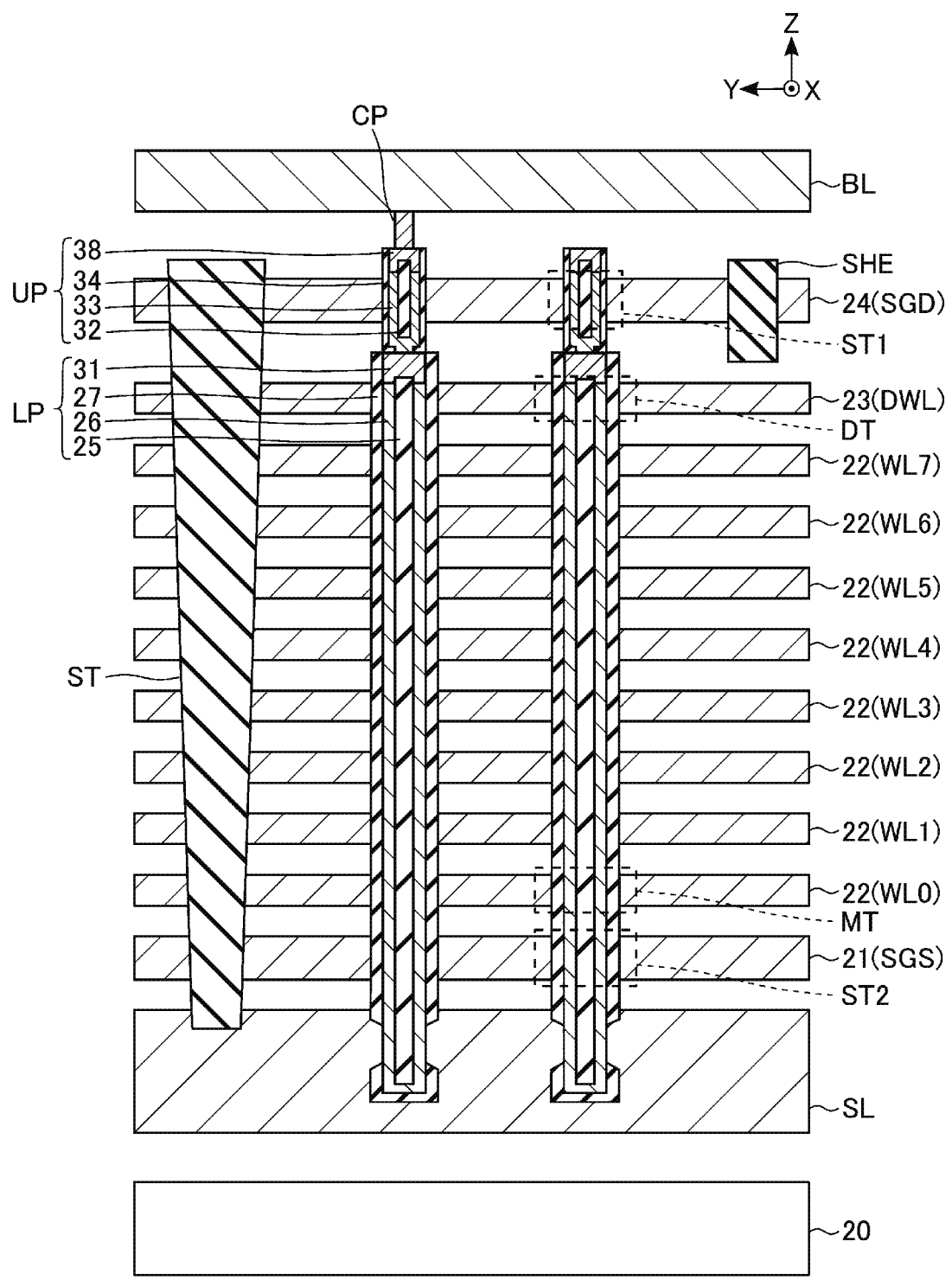
FIG. 5 is a cross-sectional view illustrating a region of the memory cell array.

FIG. 5 is a cross-sectional view illustrating a region of the memory cell array 10. FIG. 5 is a cross-sectional view cut along one bit line BL.

A substrate 20 comprises a semiconductor substrate. The source line SL is provided above the substrate 20. The source line SL is formed in a planar shape along an X-Y plane. The source line SL is formed of, for example, polycrystalline silicon.

Above the source line SL, a wiring layer 21 that functions as the selection gate line SGS, a plurality of wiring layers 22 that function as the word lines WL (including the word lines WL0 to WL7), a wiring layer 23 that functions as the dummy word line DWL, and a wiring layer 24 that functions as the selection gate line SGD are stacked in this order via a plurality of insulating layers, respectively. The wiring layers 21 to 24 include, for example, metal such as tungsten (W). In order to avoid the drawing from being complicated, FIG. 5 does not illustrate hatching of an interlayer insulating layer.

The selection gate line SGS may comprise a plurality of selection gate lines (for example, four selection gate lines). In this case, a number of selection transistors ST2 corresponding to the number of the selection gate lines SGS are provided. Likewise, the selection gate line SGD may comprise a plurality of selection gate lines (for example, four selection gate lines). In this case, a number of selection transistors ST1 corresponding to the number of the selection gate lines SGD are provided.

Each memory pillar MP comprises a lower pillar LP and an upper pillar UP. The upper pillar UP is stacked on the lower pillar LP.

The lower pillar LP contacts the source line and has a columnar shape that extends in the Z direction. The lower pillar LP penetrates the wiring layers 21 to 23. An upper end of the lower pillar LP is positioned between the wiring layer 23 and the wiring layer 24.

The upper pillar UP has a columnar shape that extends in the Z direction and penetrates the wiring layer 24. An upper end of the upper pillar UP is between the wiring layer 24 and the bit line BL.

Figure 6:
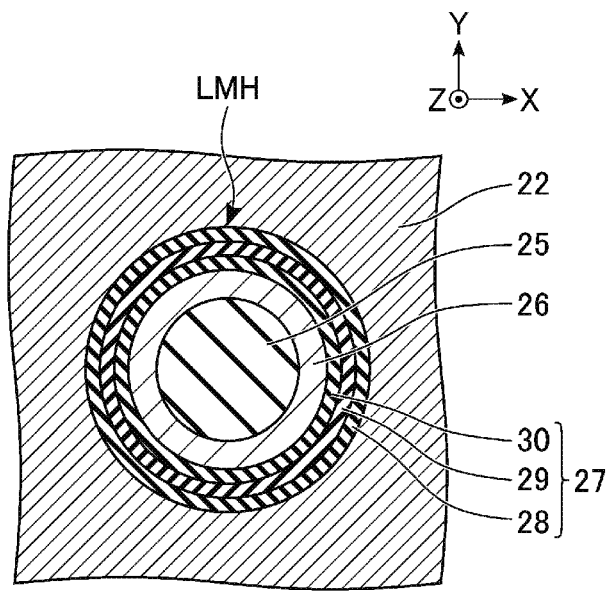
FIG. 6 is a cross-sectional view illustrating aspects of a lower pillar.

FIG. 6 is a cross-sectional view illustrating a lower pillar LP cut in a horizontal direction (a direction along the X-Y plane). FIG. 6 is a cross-sectional view including a wiring layer 22.

The lower pillar LP is provided in a memory hole LMH. A planar shape of the memory hole LMH is, for example, circular. The memory hole LMH extends in the Z direction and penetrates the wiring layers 21 to 23. The lower pillar LP includes a core layer 25, a semiconductor layer 26, and a memory film 27. The memory film 27 may comprise a plurality of films stacked one on the other outwardly from the semiconductor layer 26.

The core layer 25 extends in the Z direction. The core layer 25 comprises an insulating layer and is formed of, for example, silicon oxide ($SiO_2$).

On a side surface of the core layer 25, the semiconductor layer 26 is provided. As the semiconductor layer 26, for example, polycrystalline silicon is used. The semiconductor layer 26 is a region where a channel of the memory cell transistor MT is to be formed. As illustrated in FIG. 5, the semiconductor layer 26 is electrically connected to the source line SL by being embedded in the source line SL.

On a side surface of the semiconductor layer 26, the memory film 27 is provided. The memory film 27 includes a tunnel insulating film 28, a charge storage film 29 (also referred to as "charge storage layer" in some contexts), and a block insulating film 30. The tunnel insulating film 28 is in contact with the semiconductor layer 26. The block insulating film 30 is in contact with the wiring layers 21 to 24. As the tunnel insulating film 28, for example, silicon oxide is used. As the charge storage film 29, an insulating film is used. For example, silicon nitride (SiN) or a metal oxide (for example, hafnium oxide) is used. As the block insulating film 30, for example, silicon oxide is used.

A region where the selection gate line SGS and the lower pillar LP intersect with each other forms the selection transistor ST2. A region where the word line WL and the lower pillar LP intersect with each other forms the memory cell transistor MT. A region where the dummy word line DWL and the lower pillar LP intersect with each other forms the dummy cell transistor DT.

The lower pillar LP further includes a conductive layer 31. The conductive layer 31 is provided on the semiconductor layer 26. The conductive layer 31 comprises an N-type diffusion layer (also referred to as "$N^+$ type diffusion layer") in which a high-concentration N-type impurity, for example, phosphorus (P) or arsenic (As), has been introduced into polycrystalline silicon.

Figure 7:
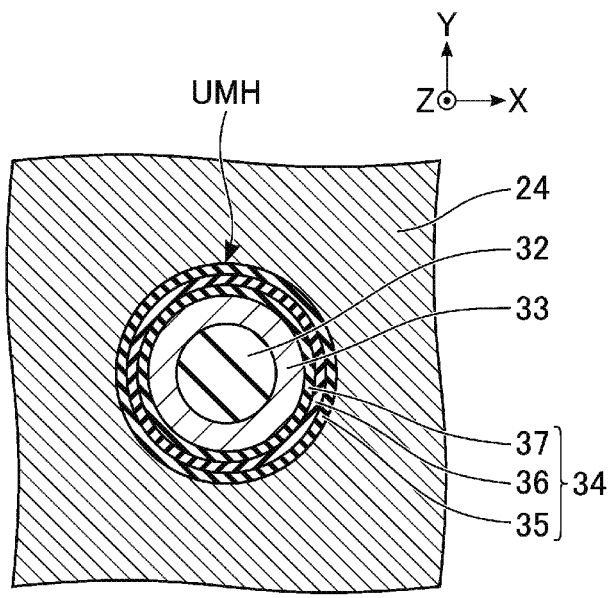
FIG. 7 is a cross-sectional view illustrating aspects of an upper pillar.

FIG. 7 is a cross-sectional view illustrating one upper pillar UP cut in a horizontal direction (a direction along the X-Y plane). FIG. 7 is a cross-sectional view including the wiring layer 24.

The upper pillar UP is provided in a memory hole UMH. A planar shape of the memory hole UMH is, for example, circular. The memory hole UMH extends in the Z direction to penetrate the wiring layer 24. The upper pillar UP includes a core layer 32, a semiconductor layer 33, and a stacked film 34.

The core layer 32 extends in the Z direction. The core layer 32 comprises an insulating layer and is formed of, for example, silicon oxide.

On a side surface of the core layer 32, the semiconductor layer 33 is provided. As the semiconductor layer 33, for example, polycrystalline silicon is used. The semiconductor layer 33 is a region where a channel of the selection transistor ST1 is to be formed. As illustrated in FIG. 5, the semiconductor layer 33 is electrically connected to the conductive layer 31 in the lower pillar LP.

On a side surface of the semiconductor layer 33, the stacked film 34 is provided. For example, the stacked film 34 has a similar configuration as the memory film 27 in the lower pillar LP. That is, for example, the stacked film 34 includes a tunnel insulating film 35, a charge storage film 36, and a block insulating film 37. However, the composition of the stacked film 34 is not particularly limited as long as it permits the stacked film to function as a gate insulating film. For example, in some embodiments, the stacked film 34 may be a single-layer insulating film formed of silicon oxide rather than a plurality of films stacked one on the other and thus references to "stacked film 34" do not necessarily imply a multi-film internal structure.

A region where the selection gate line SGD and the upper pillar UP intersect with each other forms the selection transistor ST1.

The upper pillar UP further includes a conductive layer 38. The conductive layer 38 is provided on the semiconductor layer 33. For example, the conductive layer 38 comprises an N-type diffusion layer in which a high-concentration N-type impurity is introduced into polycrystalline silicon.

The contact plug CP electrically connected to the conductive layer 38 is provided on the memory pillar MP (specifically, the upper pillar UP). The bit line BL that extends in the Y direction is provided on the contact plug CP.

[1-5] Detailed Structure of Memory Pillar MP

Figure 8:
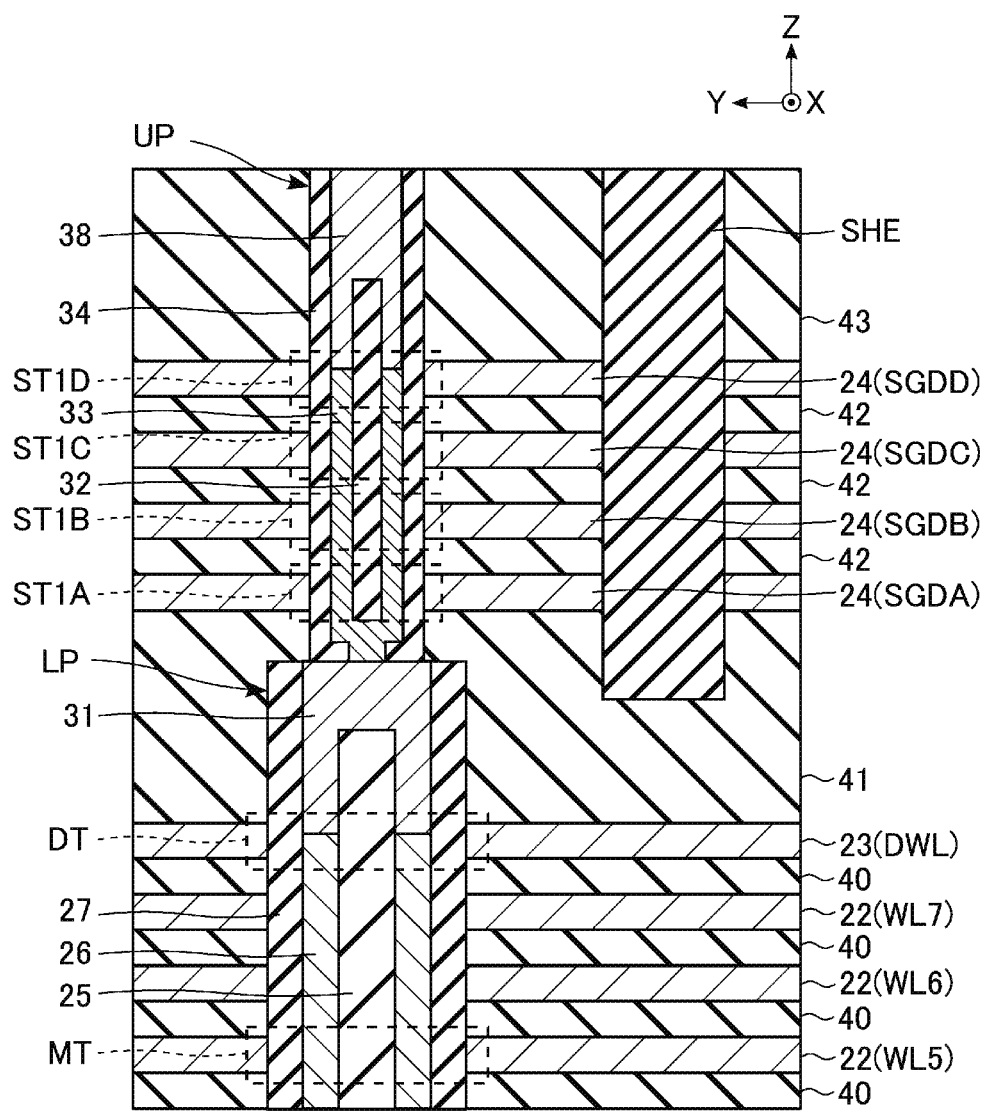
FIG. 8 is a cross-sectional view illustrating aspects of a memory pillar.

Next, a detailed structure of the memory pillar MP will be described. FIG. 8 is a detailed cross-sectional view illustrating the memory pillar MP. FIG. 8 illustrates a region of the lower pillar LP including the dummy word line DWL and the upper pillar UP.

The word lines WL and the dummy word line DWL are stacked via a plurality of interlayer insulating layers 40, respectively. An interlayer insulating layer 41 is provided on the dummy word line DWL.

The conductive layer 31 in the lower pillar LP is an N-type diffusion layer as described above. A lower end of the N-type diffusion layer 31 is lower than an upper end of the dummy word line DWL. That is, the N-type diffusion layer 31 partially extends into the dummy word line DWL.

In an example of FIG. 8, the selection gate line SGD comprises four selection gate lines SGDA, SGDB, SGDC, and SGDD. That is, the four wiring layers 24 that function as the selection gate lines SGDA, SGDB, SGDC, and SGDD are stacked on the interlayer insulating layer 41 via a plurality of interlayer insulating layers 42, respectively.

A region where the selection gate line SGDA and the upper pillar UP intersect with each other forms a selection transistor ST1A. A region where the selection gate line SGDB and the upper pillar UP intersect with each other forms a selection transistor ST1B. A region where the selection gate line SGDC and the upper pillar UP intersect with each other forms a selection transistor ST1C. A region where the selection gate line SGDD and the upper pillar UP intersect with each other forms a selection transistor ST1D. The selection transistors ST1A to ST1D are connected in series.

The upper pillar UP penetrates the four wiring layers 24. The semiconductor layer 33 in the upper pillar UP is electrically connected to the N-type diffusion layer 31. The conductive layer 38 in the upper pillar UP is an N-type diffusion layer as described above. The n-type diffusion layer 38 is electrically connected to the semiconductor layer 33.

[1-6] Operation of Semiconductor Storage Device 1

The operation of the semiconductor storage device 1 having the above-described configuration will be described.

First, the threshold voltage of the memory cell transistor MT will be described. The memory cell transistor MT in the erased state is in a state where the threshold voltage is the lowest, and the threshold voltage has, for example, a negative value. When data is written to the memory cell transistor MT, a plurality of program loops including a program operation and a verification operation are repeated.

The program operation is an operation of injecting charge (electrons) into the charge storage layer of a memory cell transistor MT to increase the threshold voltage of the memory cell transistor MT or an operation of preventing injection of electrons into the charge storage layer to maintain the threshold voltage of the memory cell transistor MT. A program voltage VPGM is applied to the selected word line. The operation of increasing the threshold voltage will be referred to as "writing of "0"", and the operation of maintaining the threshold voltage will be referred to as "writing of "1"" or "write-protect". More specifically, "writing of "0"" and "writing of "1"" are different in the voltage that are applied to the bit line BL. For example, a ground voltage Vss is applied to the bit line BL corresponding to "writing of "0"". For example, a power supply voltage Vdd (>Vss) is applied to the bit line BL corresponding to "writing of "1"".

The verification operation is an operation of reading data of a memory cell transistor MT after the program operation to determine whether or not the threshold voltage of the memory cell transistor MT reaches a target level. A desired verification voltage is applied to the selected word line. A case where the threshold voltage of the memory cell transistor MT reaches the target level will be referred to as "the verification is passed", and a case where the threshold voltage of the memory cell transistor MT does not reach the target level will be referred to as "the verification is failed". The details of the verification operation are the same as those of the read operation.

In addition, as the number of program loops increases, the program voltage VPGM is set to increase by a step-up voltage ΔVPGM. As a result, the threshold voltage of the memory cell transistor MT can be sequentially shifted stepwise.

Next, the erasing operation will be described. The erasing operation is an operation of setting the threshold voltage of the memory cell transistor MT as a threshold voltage (state "Er") in the erased state.

Figure 9:
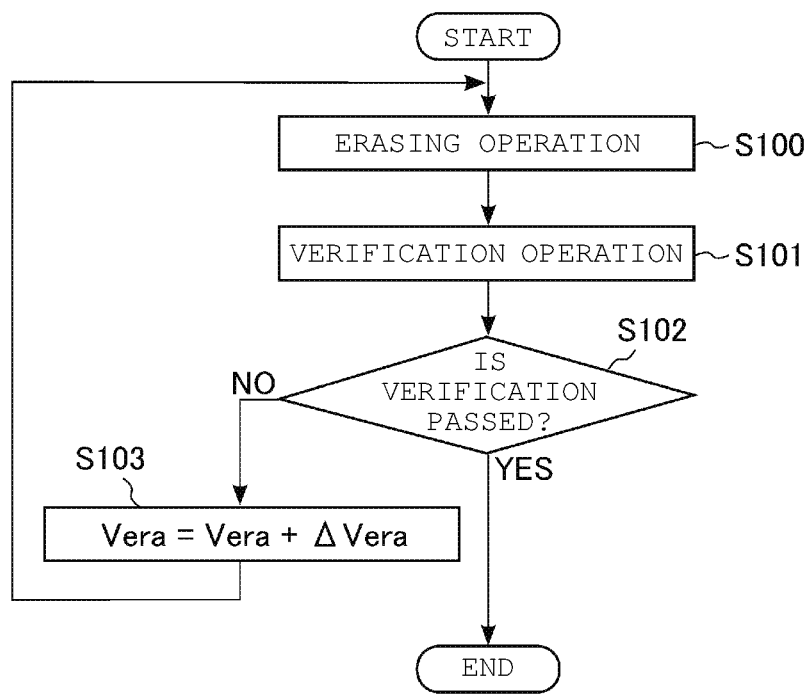
FIG. 9 is a flowchart of an erasing sequence of the semiconductor storage device according to the first embodiment.
Figure 10:
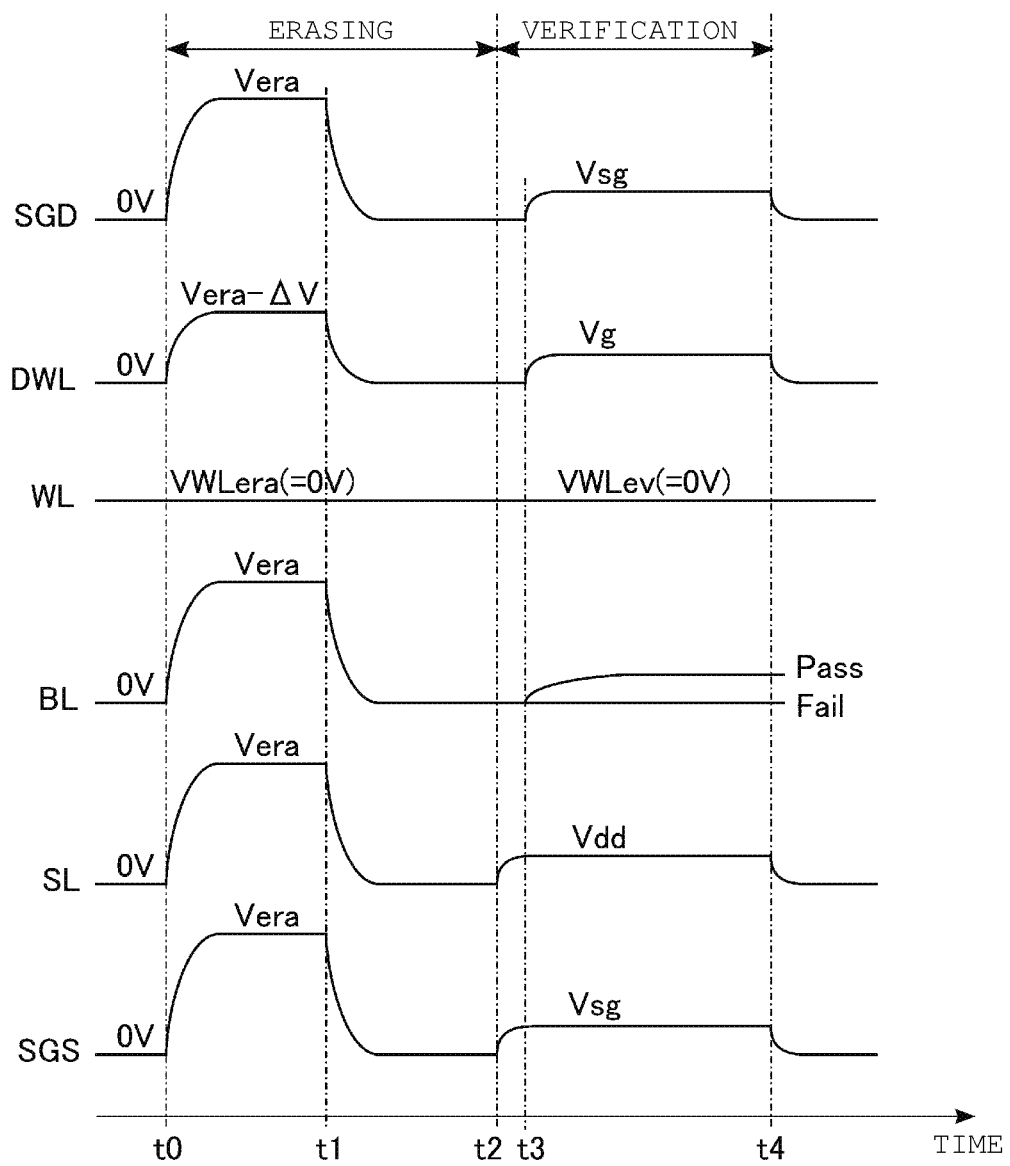
FIG. 10 is a timing chart of the erasing sequence of the semiconductor storage device according to the first embodiment.

FIG. 9 is a flowchart illustrating an erasing sequence of the semiconductor storage device 1. FIG. 10 is a timing chart illustrating the erasing sequence of the semiconductor storage device 1. The erasing sequence includes a plurality of erasing loops including an erasing operation and a verification operation.

The sequencer 17 executes the erasing operation (Step S100). In the embodiment, gate induced drain leakage ("GIDL") is generated at an end portion of the N-type diffusion layer 31 in the vicinity of the dummy word line DWL (in other words, at a channel in a gate end of the dummy cell transistor DT). A channel potential of the memory cell transistor MT is boosted using a leakage current generated by holes to execute the erasing operation.

As illustrated in FIG. 10, at time t0, the sequencer 17 applies an erasing voltage Vera to the selection gate lines SGDA to SGDD, the bit line BL, the source line SL, and the selection gate line SGS. FIG. 10 collectively illustrates the selection gate lines SGDA to SGDD as the selection gate line SGD. The sequencer 17 applies a voltage "Vera-ΔV" to the dummy word line DWL. The sequencer 17 applies a voltage VWLera to all the word lines WL. The voltage VWLera is a voltage that is sufficiently lower than the erasing voltage Vera and is, for example, the ground voltage Vss (=0 V). The voltage "Vera-ΔV" is set to be higher than 0 V and lower than the erasing voltage Vera. A voltage ΔV is a voltage for generating GIDL and is set to be, for example, about 8 V or 8 V or higher.

Figure 11:
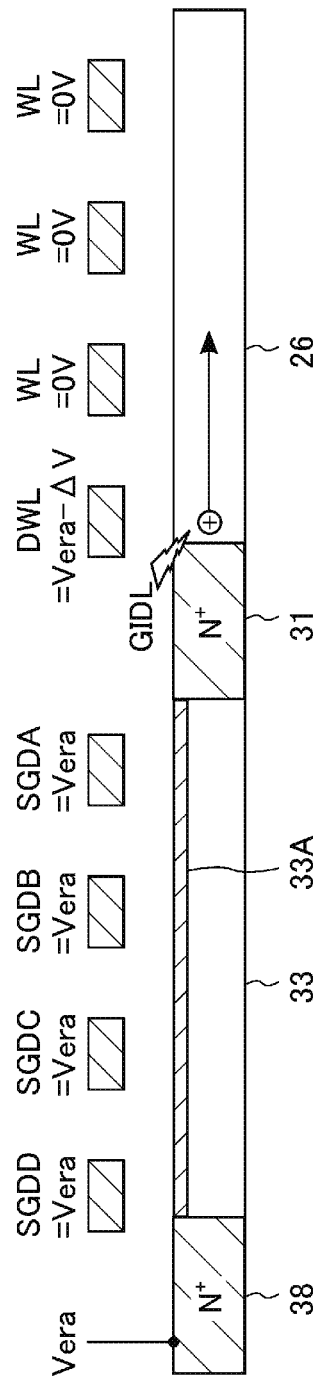
FIG. 11 is a schematic diagram illustrating aspects of an erasing operation.

FIG. 11 is a schematic diagram illustrating the erasing operation. When the erasing voltage Vera is applied to the selection gate lines SGDA to SGDD, a channel 33A (also referred to as "inversion layer") is formed on the semiconductor layer 33.

The voltage "Vera-ΔV" that is lower than the erasing voltage Vera is applied to the dummy word line DWL. As a result, GIDL is generated at an end portion of the N-type diffusion layer 31, holes are injected into the semiconductor layer 26, and the semiconductor layer 26 is charged up to about the erasing voltage Vera. In FIG. 11, "+" surrounded by a circle represents holes. As a result, a potential difference between the word line WL and the semiconductor layer 26 increases, and electrons stored in the charge storage layer of the memory cell transistor MT are extracted from the semiconductor layer 26. Thus, the threshold voltage of the memory cell transistor MT decreases.

Figure 12:
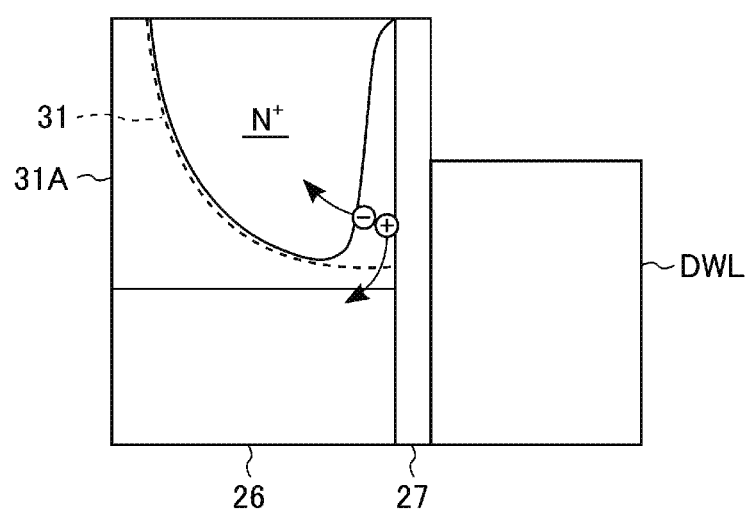
FIG. 12 is a schematic diagram illustrating a state in which a hole current is generated.

FIG. 12 is a schematic diagram illustrating a state where a hole current is generated. FIG. 12 illustrates a partial region of the dummy word line DWL and the conductive layer 31. In FIG. 12, the symbol "+" surrounded by a circle represents holes, and the symbol "−" surrounded by a circle represents electrons. FIG. 12 is a detailed cross-sectional view illustrating the N-type diffusion layer 31.

The N-type diffusion layer 31 is provided in a semiconductor layer 31A formed of polycrystalline silicon. The N-type diffusion layer 31 is a region indicated by a broken line in FIG. 12. In an example of FIG. 12, the semiconductor layer 31A is formed on the semiconductor layer 26. A high-concentration N-type impurity is introduced into the semiconductor layer 31A such that the N-type diffusion layer 31 is formed in the semiconductor layer 31A. As illustrated in FIG. 12, the N-type diffusion layer 31 is formed to enter into a region below an upper surface of the dummy word line DWL.

When a voltage is applied to the dummy word line DWL, an N-type region is formed in the N-type diffusion layer 31. In FIG. 12, the N-type region is a region indicated by a solid line in the N-type diffusion layer 31. During the erasing operation, holes are generated from a boundary of the N-type region to generate a hole current.

At time t1, each of the above-described voltages is reset.

Next, the sequencer 17 executes the erasing verification operation (Step S101). In this verification operation, a verification voltage VWLev between the state Er representing the erased state and the state "A" is used. The verification voltage VWLev is, for example, 0 V. The memory cell transistor MT having a threshold voltage that is lower than or equal to the verification voltage VWLev passes the verification.

For example, at time t2, the sequencer 17 applies the power supply voltage Vdd to the source line SL and applies a voltage Vsg to the selection gate line SGS. The voltage Vsg is a voltage at which the selection transistors ST1A to ST1D and the selection transistor ST2 enter an ON state and has a relationship of "Vsg>Vdd".

At time t3, the sequencer 17 applies the voltage Vsg to the selection gate line SGD. The sequencer 17 applies the verification voltage VWLev (=0 V) to all the word lines WL. Further, the sequencer 17 applies a voltage Vg to the dummy word line DWL. The voltage Vg is a voltage at which the dummy cell transistor DT enters an ON state, and is higher than the verification voltage VWLev (=0 V).

In the above-described erasing operation, a voltage that is higher than the voltage (0 V) applied to the word line WL is applied to the dummy word line DWL. Accordingly, the threshold voltage of the dummy cell transistor DT may be higher than the verification voltage VWLev. That is, the dummy cell transistor DT may not be set to be in the erased state. Accordingly, the voltage Vg at which the dummy cell transistor DT enters an ON state is applied to the dummy word line DWL.

Next, the sequencer 17 determines whether or not the verification is passed (Step S102). When the threshold voltages of all the memory cell transistors MT as erasing targets are lower than or equal to the verification voltage VWLev due to the above-described voltage relationship, the memory cell transistors MT are turned on such that the potential of the bit line BL is higher than 0 V. In this case, the sequencer 17 determines that the verification is passed.

On the other hand, when the threshold voltage of one memory cell transistor MT is higher than the verification voltage VWLev, the memory cell transistor MT is turned off such that the potential of the corresponding bit line BL is maintained at 0 V. In this case, the sequencer 17 determines that the verification is failed.

At time t4, each of the above-described voltages is reset.

When the verification is passed, the sequencer 17 ends the erasing sequence. On the other hand, when the verification is failed, the sequencer 17 sets the erasing voltage Vera to increase by a step-up voltage ΔVera (Step S103). Next, the sequencer 17 repeats the erasing loop.

When the verification has not yet passed when a predetermined number of times has been reached, the sequencer 17 may determine that an erasing error occurs and may output the result to the outside.

[1-7] Modification Example

Figure 13:
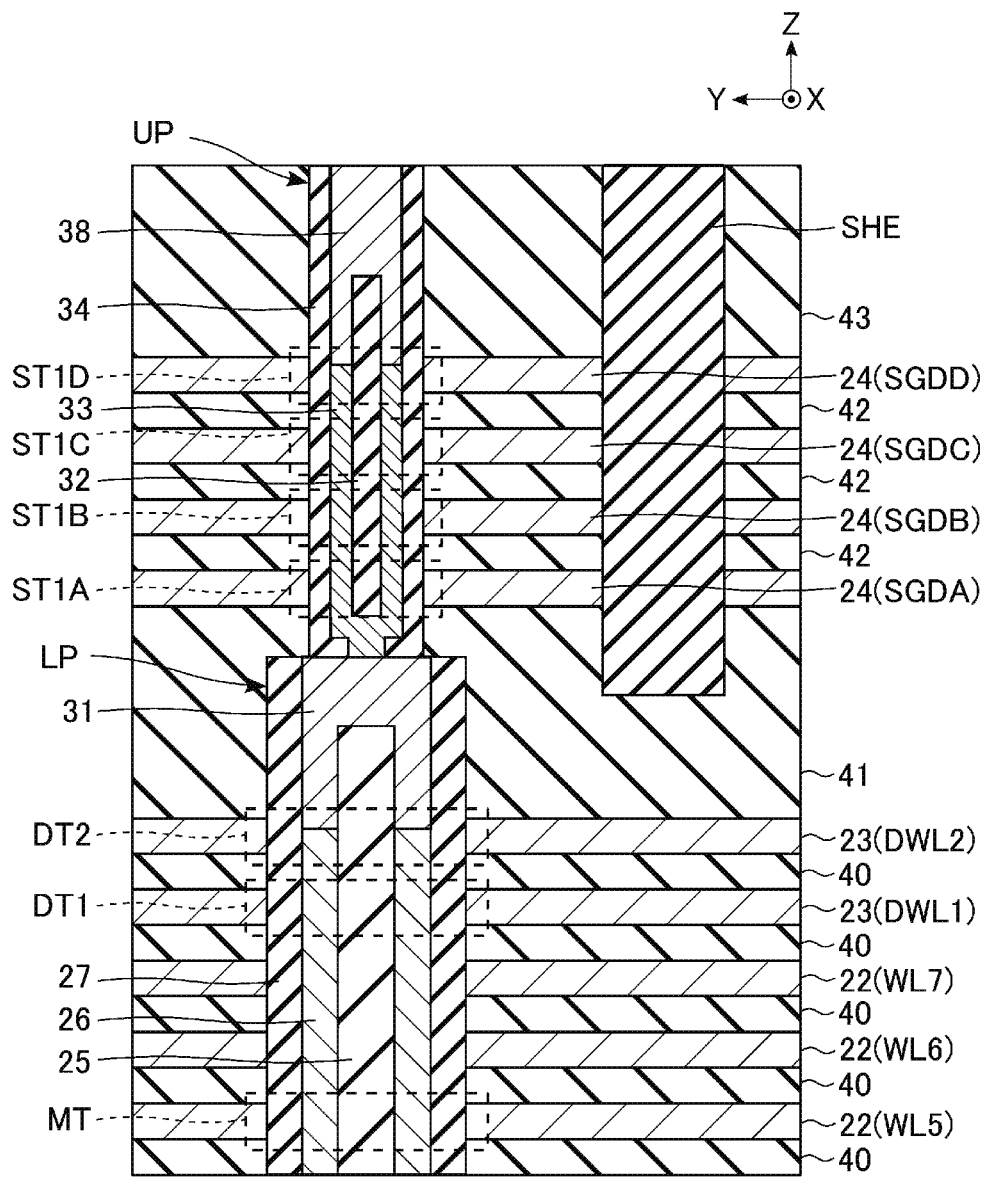
FIG. 13 is a cross-sectional view illustrating a memory pillar according to a modification example.

The number of dummy word lines DWL for generating GIDL is not limited to one and may be two. FIG. 13 is a cross-sectional view illustrating a memory pillar MP according to a modification example.

Dummy word lines DWL1 and DWL2 are stacked above the word lines WL via the interlayer insulating layers 40, respectively. The N-type diffusion layer 31 partially extends into the dummy word line DWL2. A region where the dummy word line DWL1 and the lower pillar LP intersect with each other forms a dummy cell transistor DT1. A region where the dummy word line DWL2 and the lower pillar LP intersect with each other forms a dummy cell transistor DT2.

The voltage control of the dummy word lines DWL1 and DWL2 is the same as that of the above-described dummy word line DWL.

This way, the GIDL may be generated using the two dummy word lines DWL1 and DWL2.

[1-8] Effect of First Embodiment

In the first embodiment, the semiconductor storage device 1 includes the conductive layer 31 that electrically connects the semiconductor layer 26 of the lower pillar LP and the semiconductor layer 33 of the upper pillar UP to each other. The conductive layer 31 is an N-type diffusion layer (or more generally an N-type semiconductor layer) in which a high-concentration N-type impurity has been introduced into polycrystalline silicon. In the lower pillar LP, the dummy word line DWL for generating GIDL is provided. The conductive layer 31 is formed to partially extend into the dummy word line DWL. The sequencer 17 applies the voltage "Vera-ΔV" that is lower than the erasing voltage Vera to the dummy word line DWL.

Accordingly, for the first embodiment, the semiconductor layer 26 of the lower pillar LP can be charged to the erasing voltage Vera from the bit line BL side. As a result, the erasing operation can be implemented more reliably. Further, the performance of the semiconductor storage device 1 can be improved.

In addition, the GIDL for the erasing operation can be generated using the conductive layer 31 that electrically connects the lower pillar LP and the upper pillar UP to each other.

[2] Second Embodiment

In a second embodiment, the GIDL for the erasing operation can be generated using a connection portion that connects a lower pillar, which includes a memory cell transistor, to an upper pillar, which also includes a memory cell transistor.

[2-1] Circuit Configuration of Memory Cell Array

Figure 14:
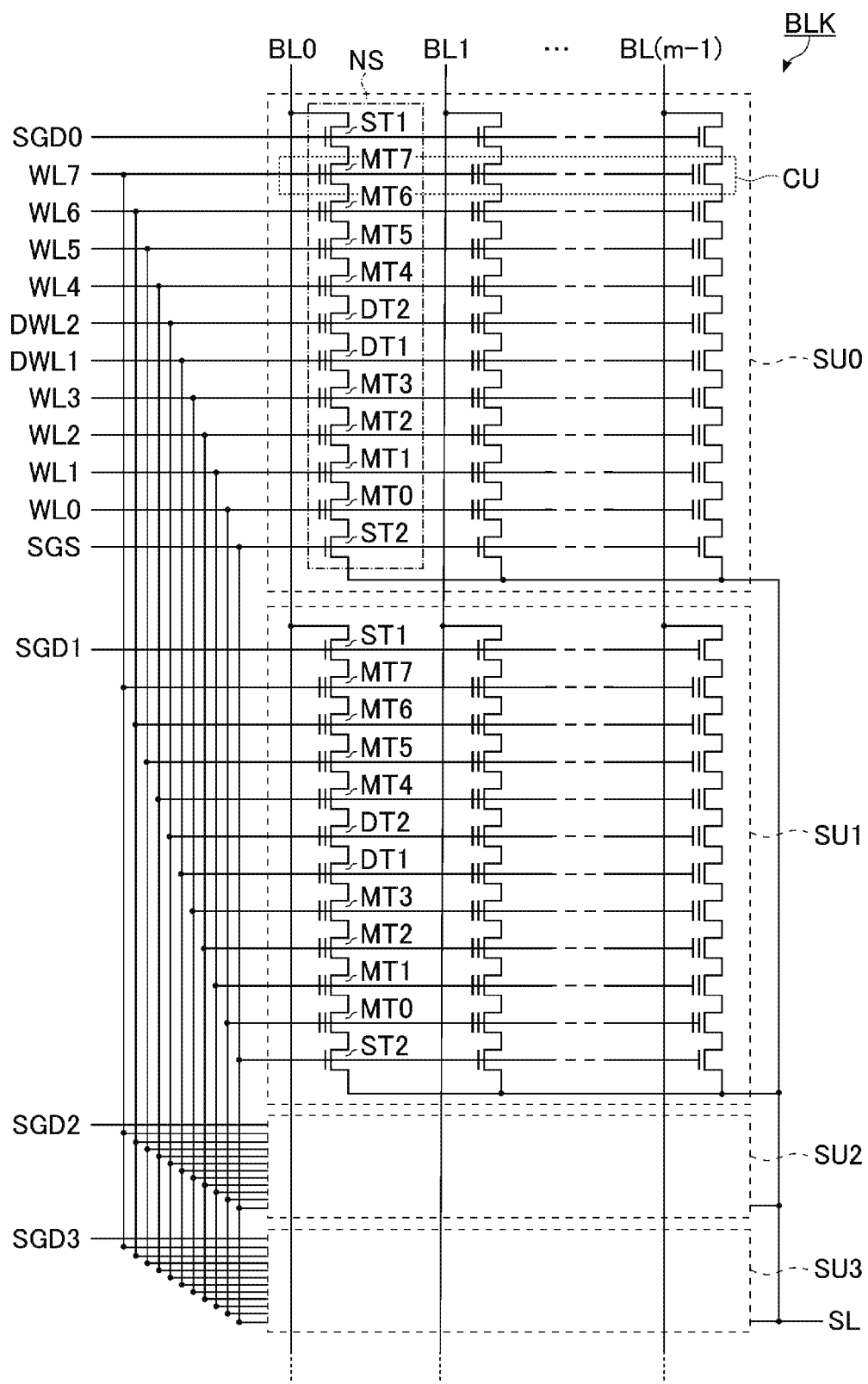
FIG. 14 is a circuit diagram illustrating a block in a memory cell array in a second embodiment.

A circuit configuration of the memory cell array 10 will be described. FIG. 14 is a circuit diagram illustrating a block BLK in the memory cell array 10 according to the second embodiment.

In this example, each of the NAND strings NS includes a plurality of memory cell transistors MT, two dummy cell transistors DT1 and DT2, and the two selection transistors ST1 and ST2. The dummy cell transistors DT1 and DT2 have the same structure as that of the memory cell transistor MT, but are not used for storing data.

The dummy cell transistors DT1 and DT2 are connected in series between a first group of memory cell transistors MT and a second group of memory cell transistors MT. In an example of FIG. 14, the dummy cell transistors DT1 and DT2 are in series between a memory cell transistor MT3 and a memory cell transistor MT4.

The dummy word line DWL1 is connected to a gate of the dummy cell transistor DT1.

The dummy word line DWL2 is connected to a gate of the dummy cell transistor DT2.

[2-2] Structure of Memory Cell Array

Next, a structure of the memory cell array 10 will be described. A plan view of the memory cell array 10 is the same as that of FIG. 4.

Figure 15:
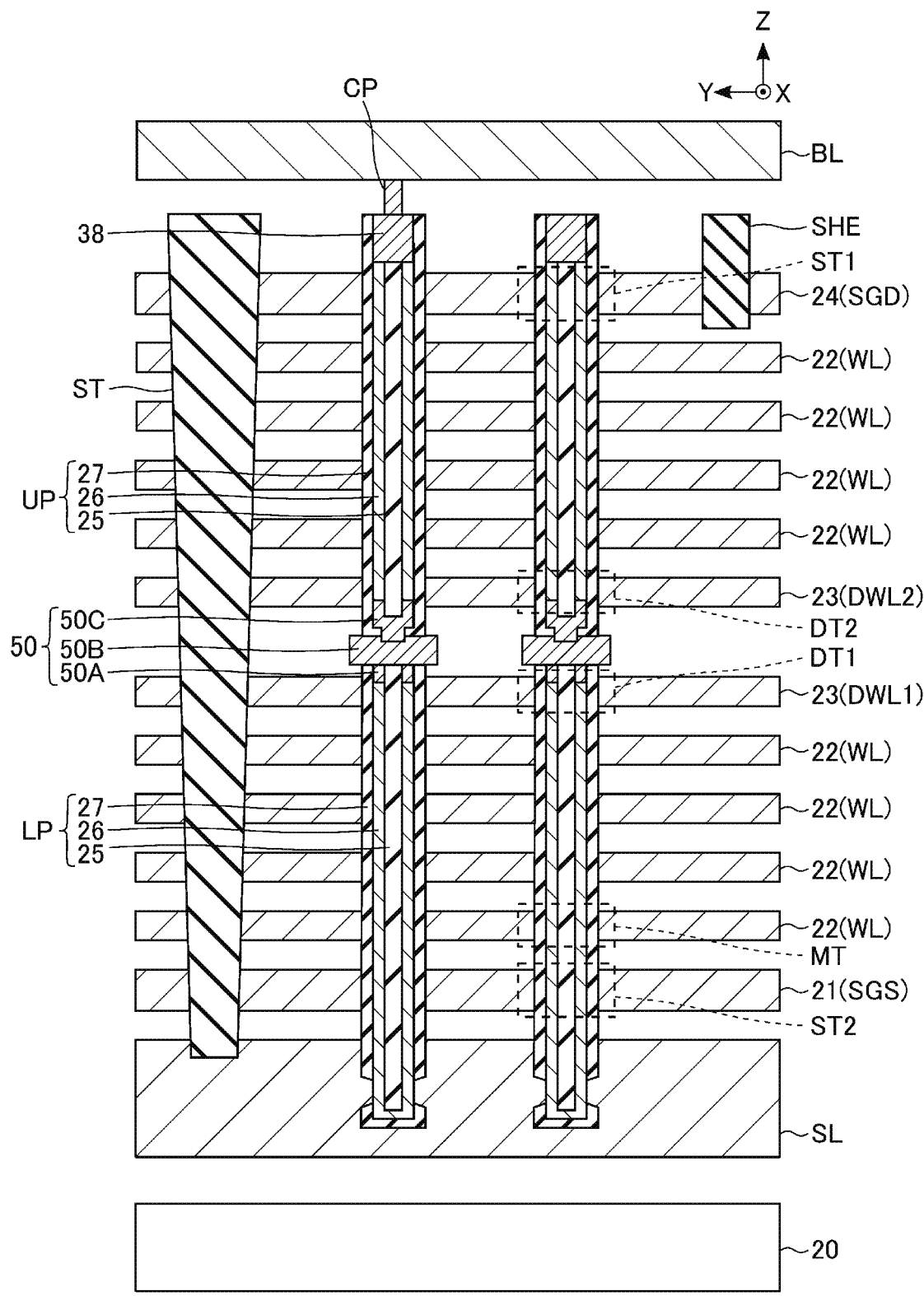
FIG. 15 is a cross-sectional view illustrating a region of the memory cell array.

FIG. 15 is a cross-sectional view illustrating a region of the memory cell array 10. Each memory pillar MP includes a lower pillar LP and an upper pillar UP.

The lower pillar LP penetrates the wiring layers 21 to 23. The lower pillar LP includes the core layer 25, the semiconductor layer 26, and the memory film 27.

The wiring layer 23 on the lower pillar LP side functions as the dummy word line DWL1. A region where the dummy word line DWL1 and the lower pillar LP intersect with each other forms the dummy cell transistor DT1.

A connection portion 50 is provided on the semiconductor layer 26 of the lower pillar LP. The connection portion 50 has a function of electrically connecting the lower pillar LP and the upper pillar UP to each other. The connection portion 50 includes conductive layers 50A, 50B, 50C. Each of the conductive layers 50A to 50C is an N-type diffusion layer (e.g., an N$^+$ type diffusion layer) in which a high-concentration N-type impurity is introduced into polycrystalline silicon. The details of the conductive layers 50A to 50C will be described below.

The upper pillar UP is provided on the connection portion 50. The upper pillar UP penetrates the wiring layers 22 to 24. As in the lower pillar LP, the upper pillar UP includes the core layer 25, the semiconductor layer 26, and the memory film 27.

The wiring layer 23 on the upper pillar UP side functions as the dummy word line DWL2. A region where the dummy word line DWL2 and the upper pillar UP intersect with each other forms the dummy cell transistor DT2.

The conductive layer 38 is provided on the semiconductor layer 26 of the upper pillar UP. For example, the conductive layer 38 is an N-type diffusion layer in which a high-concentration N-type impurity has been introduced into polycrystalline silicon.

[2-3] Detailed Structure of Memory Pillar

Figure 16:
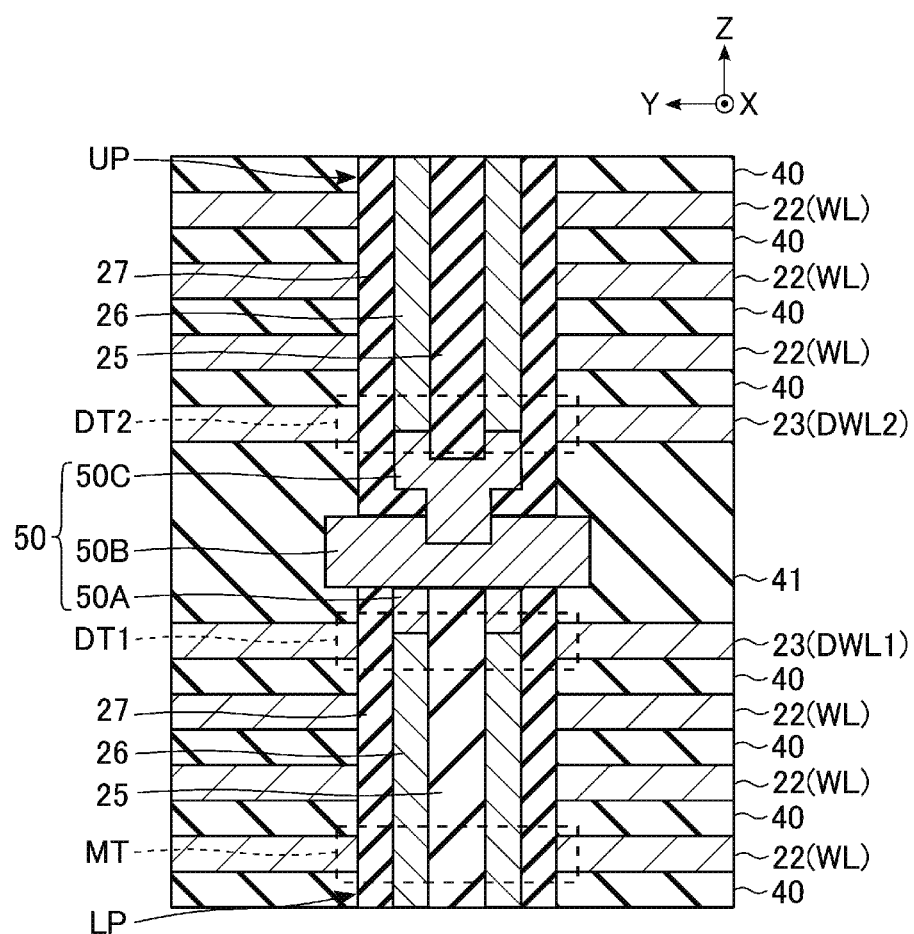
FIG. 16 is a cross-sectional view illustrating aspects of a memory pillar.

Next, a structure of the memory pillar MP will be described. FIG. 16 is a detailed cross-sectional view illustrating the memory pillar MP. FIG. 16 illustrates a center portion of the memory pillar MP centered on the connection portion 50.

The word lines WL and the dummy word line DWL1 are stacked via interlayer insulating layers 40. The interlayer insulating layer 41 is provided on the dummy word line DWL1. The dummy word line DWL2 is provided on the interlayer insulating layer 41. The word lines WL are stacked on the dummy word line DWL2 via the interlayer insulating layers 40.

The connection portion 50 includes the conductive layers 50A, 50B, 50C. As described above, the conductive layers 50A to 50C are formed of an N-type diffusion layer. A lower end of the N-type diffusion layer 50A is lower than an upper end of the dummy word line DWL1. That is, the N-type diffusion layer 50A partially extend into the dummy word line DWL1.

An upper end of the N-type diffusion layer 50C is higher than a lower end of the dummy word line DWL2. That is, the N-type diffusion layer 50C partially extend into the dummy word line DWL2.

For example, the N-type diffusion layers 50A and 50C are formed as follows. After forming the semiconductor layer 26 of the lower pillar LP, the N-type diffusion layer 50B into which an N-type impurity is introduced is formed on the semiconductor layer 26. In addition, the semiconductor layer 26 of the upper pillar UP is formed on the N-type diffusion layer 50B. By diffusing the N-type impurity of the N-type diffusion layer 50B into the upper and lower semiconductor layers 26 through a thermal process, the N-type diffusion layers 50A and 50C are formed.

[2-4] Operation of Semiconductor Storage Device

Figure 17:
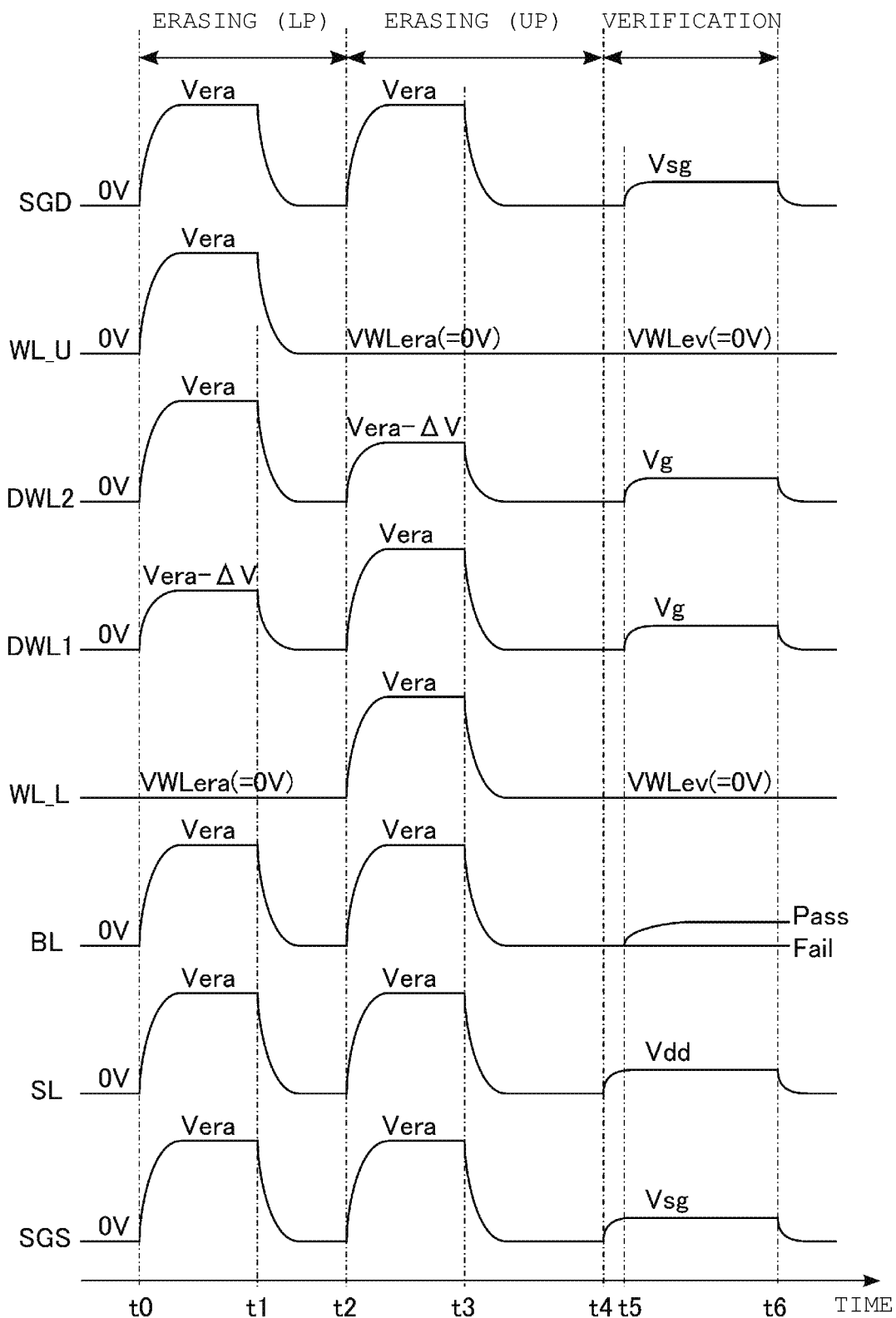
FIG. 17 is a timing chart of aspects an erasing sequence of the semiconductor storage device according to the second embodiment.

The operation of the semiconductor storage device 1 having the above-described configuration will be described. FIG. 17 is a timing chart illustrating the erasing sequence of the semiconductor storage device 1.

The erasing operation includes an erasing operation for erasing data of the memory cell transistors MT of the lower pillar LP and an erasing operation for erasing data of the memory cell transistors MT of the upper pillar UP. In FIG. 17, the erasing operation on the lower pillar LP side is represented by "Erasing (LP)", and the erasing operation on the upper pillar UP side is represented by "Erasing (UP)". In the following description and drawings, a word line on the lower pillar LP side is represented by "WL_L", and a word line on the upper pillar UP side is represented by "WL_U".

First, the erasing operation on the lower pillar LP side is executed. At time t0, the sequencer 17 applies the erasing voltage Vera to the selection gate line SGD, the word line WL_U, the dummy word line DWL2, the bit line BL, the source line SL, and the selection gate line SGS. The sequencer 17 applies the voltage "Vera-$\Delta$V" to the dummy word line DWL1. The sequencer 17 applies the voltage VWLera (=0 V) to the word lines WL_L.

Figure 18:
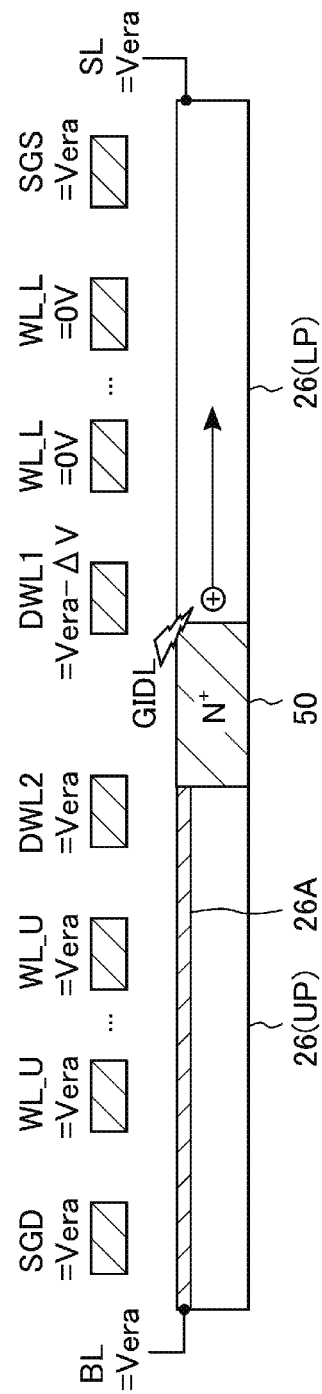
FIG. 18 is a schematic diagram illustrating an erasing operation for a lower pillar side.

FIG. 18 is a schematic diagram illustrating the erasing operation on the lower pillar LP side. When the erasing voltage Vera is applied to the selection gate line SGD, the word line WL_U, and the dummy word line DWL2, a channel 26A is formed on the semiconductor layer 26 of the upper pillar UP.

The voltage "Vera-$\Delta$V" that is lower than the erasing voltage Vera is applied to the dummy word line DWL1. As a result, GIDL is generated at an end portion of the N-type diffusion layer 50, and the semiconductor layer 26 of the lower pillar LP is charged up to about the erasing voltage Vera. As a result, a potential difference between the word line WL_L and the semiconductor layer 26 increases, and electrons stored in the charge storage layer of the memory cell transistors MT are extracted from the semiconductor layer 26. Thus, the threshold voltage of the memory cell transistors MT decreases.

At time t1, each of the above-described voltages is reset.

Next, the erasing operation on the upper pillar UP side is executed. At time t2, the sequencer 17 applies the erasing voltage Vera to the selection gate line SGD, the dummy word line DWL1, the word line WL_L, the bit line BL, the source line SL, and the selection gate line SGS. The sequencer 17 applies the voltage "Vera-ΔV" to the dummy word line DWL2. The sequencer 17 applies the voltage VWLera (=0 V) to the word lines WL_U.

Figure 19:
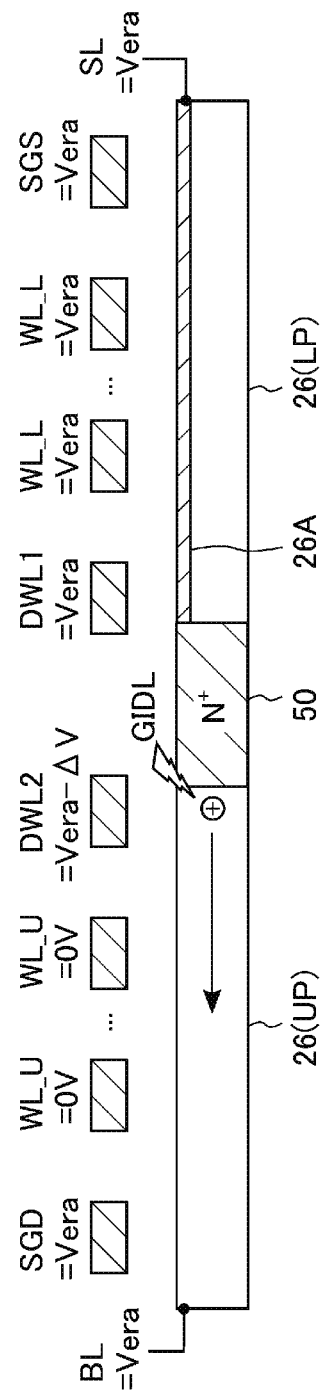
FIG. 19 is a schematic diagram illustrating an erasing operation for an upper pillar side.

FIG. 19 is a schematic diagram illustrating the erasing operation on the upper pillar UP side. When the erasing voltage Vera is applied to the dummy word line DWL1, the word line WL_L, and the selection gate line SGS, the channel 26A is formed on the semiconductor layer 26 of the lower pillar LP.

The voltage "Vera-ΔV" that is lower than the erasing voltage Vera is applied to the dummy word line DWL2. As a result, GIDL is generated at an end portion of the N-type diffusion layer 50, and the semiconductor layer 26 of the upper pillar UP is charged up to about the erasing voltage Vera. As a result, a potential difference between the word line WL_U and the semiconductor layer 26 increases, and electrons stored in the charge storage layer of the memory cell transistor MT are extracted from the semiconductor layer 26. Thus, the threshold voltage of the memory cell transistor MT decreases.

At time t3, each of the above-described voltages is reset.

At time t4 to t6, the sequencer 17 executes the verification operation. In the verification operation, the sequencer 17 applies the voltage Vg at which the dummy cell transistors DT1 and DT2 enter an ON state to the dummy word lines DWL1 and DWL2. The rest of the operation is substantially the same as that of the verification operation of the first embodiment.

The particular order of the erasing operation is not limited to the order of the lower pillar LP and then the upper pillar UP and may be reversed.

[2-5] Modification Example

Figure 20:
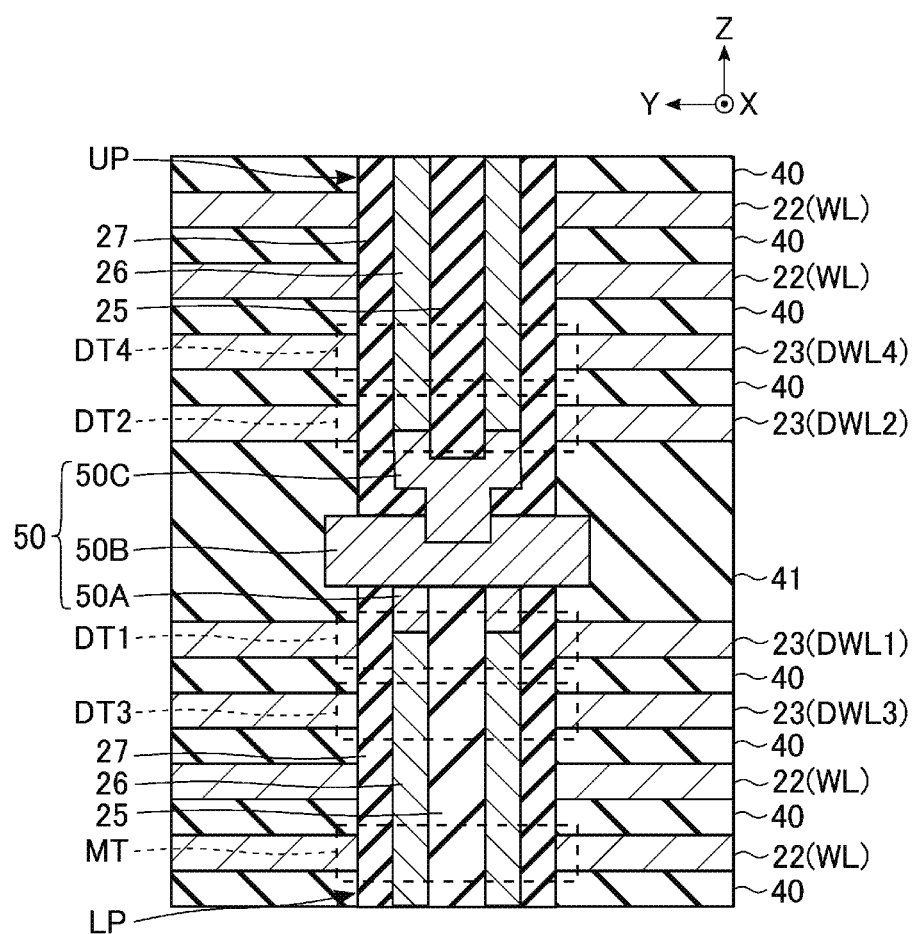
FIG. 20 is a cross-sectional view illustrating a memory pillar according to a modification example.

The number of dummy word lines DWL for generating the GIDL is not limited to one and may be two. FIG. 20 is a cross-sectional view illustrating a memory pillar MP according to a modification example.

A dummy word line DWL3 is provided below the dummy word line DWL1 via the interlayer insulating layer 40. A region where the dummy word line DWL3 and the lower pillar LP intersect with each other forms a dummy cell transistor DT3.

A dummy word line DWL4 is provided above the dummy word line DWL2 via the interlayer insulating layer 40. A region where the dummy word line DWL4 and the upper pillar UP intersect with each other forms a dummy cell transistor DT4.

The voltage control of the dummy word line DWL3 is the same as that of the above-described dummy word line DWL1. The voltage control of the dummy word line DWL4 is the same as that of the above-described dummy word line DWL2.

This way, GIDL may be generated using the two dummy word lines DWL1 and DWL3. Likewise, GIDL may be generated using the two dummy word lines DWL2 and DWL4.

[2-6] Effect of Second Embodiment

In the second embodiment, the semiconductor storage device 1 includes: the connection portion 50 that electrically connects the semiconductor layer 26 of the lower pillar LP to the semiconductor layer 26 of the upper pillar UP The dummy word lines DWL1 and DWL2 are provided above and below the connection portion 50 to generate GIDL. The connection portion 50 includes the conductive layers 50A, 50B, 50C. Each of the conductive layers 50A to 50C comprise an N-type diffusion layer in which a high-concentration N-type impurity is introduced into polycrystalline silicon. The conductive layer 50A is formed to partially extend into the dummy word line DWL1. A conductive layer 50C is formed to extend into the dummy word line DWL2. In the first erasing operation, the sequencer 17 applies the voltage "Vera-ΔV" that is lower than the erasing voltage Vera to the dummy word line DWL1. In the second erasing operation, the sequencer 17 applies the voltage "Vera-ΔV" to the dummy word line DWL2.

Accordingly, in the second embodiment, the semiconductor layer 26 can be charged to the erasing voltage Vera using the connection portion 50 that electrically connects the lower pillar LP and the upper pillar UP to each other. As a result, the erasing operation can be implemented more reliably. Further, the performance of the semiconductor storage device 1 can be improved.

[3] Modification Examples

The semiconductor storage device according to an embodiment includes: a source line, a first selection gate line, a plurality of word lines, a first dummy word line, and a second selection gate line that are stacked in a first direction in the stated order from the bottom; a first semiconductor layer that extends through the first selection gate line, the word lines, and the first dummy word line in the first direction and is electrically connected to the source line; a plurality of memory cells that are formed at intersections between the first semiconductor layer and the word lines; a conductive layer that is provided on the first semiconductor layer, partially extends into the first dummy word line in a stacking direction, and is formed of an N-type diffusion layer; a second semiconductor layer that extends in through the second selection gate line in the first direction and is in contact with the conductive layer; a bit line that is provided above the second selection gate line and is electrically connected to the second semiconductor layer; and a control circuit. During an erasing operation of the memory cells, the control circuit applies: a first voltage, such as Vera, to the source line, the first selection gate line, the second selection gate line, and the bit line; a second voltage, for example<0 V, that is lower than the first voltage to the word lines; and a third voltage, such as Vera-ΔV, that is between the first voltage and the second voltage to the first dummy word line.

The semiconductor storage device according to another embodiment includes: a source line, a first selection gate line, a plurality of first word lines, and a first dummy word line that are stacked in a first direction in the stated order from the bottom; a first semiconductor layer that extends through the first selection gate line, the first word lines, and the first dummy word line in the first direction and is electrically connected to the source line; a plurality of first memory cells that are formed at intersections between the first semiconductor layer and the first word lines; a connection portion that is provided on the first semiconductor layer and is formed of an N-type diffusion layer; a second dummy word line, a plurality of second word lines, and a second selection gate line that are stacked in the first direction in the stated order from the bottom above the connection portion; a second semiconductor layer that extends through the second dummy word line, the second word lines, and the second selection gate line in the first direction and is electrically connected to the connection portion; a plurality of second memory cells that are formed at intersections between the second semiconductor layer and the second word lines; a bit line that is provided above the second selection gate line and is electrically connected to the second semiconductor layer; and a control circuit. The connection portion includes: a first conductive layer which partially extends into the first dummy word line in a stacking direction and is formed of an N-type diffusion layer; and a second conductive layer that partially extends into the second dummy word line in the stacking direction and is formed of an N-type diffusion layer. During an erasing operation of the first memory cells, the control circuit applies: a first voltage, for example Vera, to the source line, the first selection gate line, the second dummy word line, the second word lines, the second selection gate line, and the bit line; a second voltage, for example 0 V, that is lower than the first voltage to the first word lines; and a third voltage, for example Vera-ΔV, that is between the first voltage and the second voltage to the first dummy word line.

In this specification, "connection" refers to an electrical connection and does not exclude connection between elements via another intervening electrically conductive element.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor storage device, comprising:
    a source line, a first selection gate line, a plurality of word lines, a first dummy word line, and a second selection gate line stacked one above the other in a first direction;
    a first pillar including a first semiconductor layer, the first pillar extending in the first direction through the first selection gate line, the word lines, and the first dummy word line, the first semiconductor layer being electrically connected to the source line;
    a plurality of memory cells at intersections of the first pillar and the word lines;
    a conductive layer at an end of the first pillar, extending into the first dummy word line, and being an N-type diffusion layer;
    a second pillar including a second semiconductor layer, the second pillar extending in the first direction through the second selection gate line, the second semiconductor layer in contact with the conductive layer;
    a bit line above the second selection gate line in the first direction and electrically connected to the second semiconductor layer; and
    a control circuit configured to apply during an erasing operation of the memory cells:
        a first voltage to the source line, the first selection gate line, the second selection gate line, and the bit line,
        a second voltage lower than the first voltage to the word lines, and
        a third voltage that is between the first voltage and the second voltage to the first dummy word line.

2. The semiconductor storage device according to claim 1, wherein the third voltage is less than the first voltage by at least 8 V.

3. The semiconductor storage device according to claim 1, further comprising:
    a second dummy word line between the first dummy word line and the word line, wherein
    the control circuit is configured to apply the third voltage to the second dummy word line during the erasing operation.

4. The semiconductor storage device according to claim 3, wherein the third voltage is less than the first voltage by at least 8 V.

5. The semiconductor storage device according to claim 1, wherein the conductive layer is polycrystalline silicon.

6. The semiconductor storage device according to claim 5, the second semiconductor layer is polycrystalline silicon.

7. The semiconductor storage device according to claim 1, wherein the first semiconductor layer surrounds an insulating core of the first pillar.

8. The semiconductor storage device according to claim 1, wherein
    the first semiconductor layer surrounds a first insulating core of the first pillar,
    the second semiconductor layer surrounds a second insulating core of the second pillar, and
    the conductive layer is between the first insulating core and the second insulating core in the first direction.

9. The semiconductor storage device according to claim 8, further comprising:
    a memory film on the first semiconductor layer and surrounding the first insulating core; and
    a stacked film on the second semiconductor layer and surrounding the second insulating core, wherein
    the conductive layer contacts an end portion of the stacked film, and
    a portion of the conductive layer is between the memory film and the first insulating core in a second direction intersecting the first direction.

10. The semiconductor storage device according to claim 1, wherein the stacked film is an insulating film.

11. A semiconductor storage device, comprising:
    a source line, a first selection gate line, a plurality of first word lines, and a first dummy word line that are stacked one above the other in a first direction;
    a first semiconductor layer that extends in the first direction through the first selection gate line, the first word lines, and the first dummy word line and is electrically connected to the source line;
    a plurality of first memory cells at intersections of the first semiconductor layer and the first word lines;
    a connection portion contacting the first semiconductor layer and formed of an N-type diffusion layer;
    a second dummy word line, a plurality of second word lines, and a second selection gate line that are stacked one above the other in the first direction above the connection portion;
    a second semiconductor layer that extends in the first direction through the second dummy word line, the second word lines, and the second selection gate line and is electrically connected to the connection portion;
    a plurality of second memory cells at intersections of the second semiconductor layer and the second word lines;
    a bit line above the second selection gate line in the first direction and electrically connected to the second semiconductor layer; and a control circuit configured to apply during an erasing operation of the first memory cells:
   a first voltage to the source line, the first selection gate line, the second dummy word line, the second word lines, the second selection gate line, and the bit line,
   a second voltage lower than the first voltage to the first word lines, and
   a third voltage between the first voltage and the second voltage to the first dummy word line, wherein
the connection portion includes:
   a first conductive layer extending into the first dummy word line in the first direction and being an N-type diffusion layer, and
   a second conductive layer extending into the second dummy word line in the first direction and being an N-type diffusion layer.

12. The semiconductor storage device according to claim 11, wherein the control circuit is further configured to apply during an erasing operation of the second memory cells:
   the first voltage to the source line, the first selection gate line, the first dummy word line, the first word lines, the second selection gate line, and the bit line,
   the second voltage to the second word lines, and
   the third voltage to the second dummy word line.

13. The semiconductor storage device according claim 12, further comprising:
   a third dummy word line between the second dummy word line and the second word line, wherein
   the control circuit is configured to apply the third voltage to the third dummy word line during the erasing operation of the second memory cells.

14. The semiconductor storage device according to claim 11, further comprising:
   a third dummy word line between the first dummy word line and the first word line in the first direction, wherein
   the control circuit is configured to apply the third voltage to the third dummy word line during the erasing operation of the first memory cells.

15. The semiconductor storage device according to claim 11, wherein the third voltage is less than the first voltage by at least 8 V.

16. The semiconductor storage device according to claim 15, wherein
   the first semiconductor layer surrounds a first insulating core,
   the second semiconductor layer surrounds a second insulating core, and
   the connection portion is between the first insulating core and the second insulating core in the first direction.

17. The semiconductor storage device according to claim 16, further comprising:
   a first memory film on the first semiconductor layer and surrounding the first insulating core; and
   a second memory film on the second semiconductor layer and surrounding the second insulating core, wherein
   the first conductive layer is between the first memory film and the first insulating core in a second direction intersecting the first direction, and
   the second conductive layer is between the second memory film and the second insulating core in the second direction.

18. A semiconductor memory device, comprising:
   a plurality of word line layers stacked in a first direction;
   a dummy word line layer above the plurality of word line layers in the first direction;
   a first pillar portion extending in the first direction through the dummy word line layer and the word line layers, a first end of the first pillar portion being connected to a source line, the first pillar portion comprising a first insulating core, a first semiconductor layer on the first insulating core, and a memory film on the first semiconductor layer between the first semiconductor layer and the word line layers;
   a N-type diffusion layer portion electrically contacting the first semiconductor layer at a second end of the first pillar portion;
   a second pillar portion extending in the first direction from the N-type diffusion layer portion, the second pillar portion comprising a second insulating core, a second semiconductor layer on the second insulating core, and a stacked film on the second semiconductor layer, wherein
   the N-type diffusion layer portion extends into the second end of the first pillar portion to a position overlapping with the first dummy word line layer, and
   the second semiconductor layer is connected to the N-type diffusion layer portion.

19. The semiconductor memory device according to claim 18, wherein the second pillar portion extends through a plurality of selection gate line layers.

20. The semiconductor memory device according to claim 18, wherein the second pillar portion extends through another plurality of word lines.

* * * * *